(12) United States Patent
Chou et al.

(10) Patent No.: US 12,477,712 B2
(45) Date of Patent: Nov. 18, 2025

(54) MEMORY STRUCTURE AND METHOD FOR MANUFACTURING THE SAME

(71) Applicant: Taiwan Semiconductor Manufacturing Company, Ltd., Hsinchu (TW)

(72) Inventors: Hung-Ju Chou, Taipei (TW); Yuan-Ching Peng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 604 days.

(21) Appl. No.: 17/747,064

(22) Filed: May 18, 2022

(65) Prior Publication Data
US 2023/0380130 A1   Nov. 23, 2023

(51) Int. Cl.
*H10B 10/00* (2023.01)
*H10D 30/67* (2025.01)
*H10D 62/10* (2025.01)

(52) U.S. Cl.
CPC ....... *H10B 10/125* (2023.02); *H10D 30/6713* (2025.01); *H10D 30/6729* (2025.01); *H10D 30/6757* (2025.01); *H10D 62/118* (2025.01)

(58) Field of Classification Search
None
See application file for complete search history.

(56) References Cited

U.S. PATENT DOCUMENTS

| 9,209,247 | B2 | 12/2015 | Colinge et al. |
| 9,236,267 | B2 | 1/2016 | De et al. |
| 9,412,817 | B2 | 8/2016 | Yang et al. |
| 9,412,828 | B2 | 8/2016 | Ching et al. |
| 9,472,618 | B2 | 10/2016 | Oxland |
| 9,502,265 | B1 | 11/2016 | Jiang et al. |
| 9,520,482 | B1 | 12/2016 | Chang et al. |
| 9,536,738 | B2 | 1/2017 | Huang et al. |
| 9,576,814 | B2 | 2/2017 | Wu et al. |
| 9,608,116 | B2 | 3/2017 | Ching et al. |
| 2008/0273382 | A1* | 11/2008 | Wang ..................... H10B 10/00 365/181 |
| 2009/0175062 | A1* | 7/2009 | Houston ........... H01L 21/76895 438/599 |
| 2011/0317485 | A1* | 12/2011 | Liaw ................. H01L 29/66795 365/182 |
| 2012/0086082 | A1* | 4/2012 | Malinge ................... G11C 8/16 257/E21.532 |
| 2021/0057023 | A1* | 2/2021 | Liaw ................ H01L 29/78696 |

* cited by examiner

*Primary Examiner* — Sarah K Salerno
(74) *Attorney, Agent, or Firm* — McClure, Qualey & Rodack, LLP

(57) ABSTRACT

A memory structure includes a first pull-up (PU) transistor and a first pull-down (PD) transistor sharing a first gate structure extending in a first direction, and a second PU transistor and a second PD transistor sharing a second gate structure extending in the first direction. The first gate structure has a first PU portion that corresponds with the first PU transistor and a first PD portion that corresponds with the first PD transistor. The second gate structure has a second PU portion that corresponds with the second PU transistor and a second PD portion that corresponds with the second PD transistor. The first and second PU portion each has a first dimension in a second direction perpendicular to the first direction, and the first and second PD portion each has a second dimension in the second direction. The first dimension is greater than the second dimension.

20 Claims, 12 Drawing Sheets

MEMORY STRUCTURE AND METHOD FOR MANUFACTURING THE SAME

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs. Hence, semiconductor manufacturing processes need continued improvement.

Static random access memory (SRAM) generally refers to any memory or storage that can retain stored data only when power is applied. SRAM chips may be used towards a variety of different applications requiring different performance characteristics. As IC technologies progress towards smaller technology nodes, gate-all-around (GAA) transistors have been incorporated into SRAMs to reduce chip footprint while maintaining reasonable processing margins. However, existing SRAMs provide limited design flexibility as IC technology nodes continually scale. Accordingly, although existing SRAM technologies have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
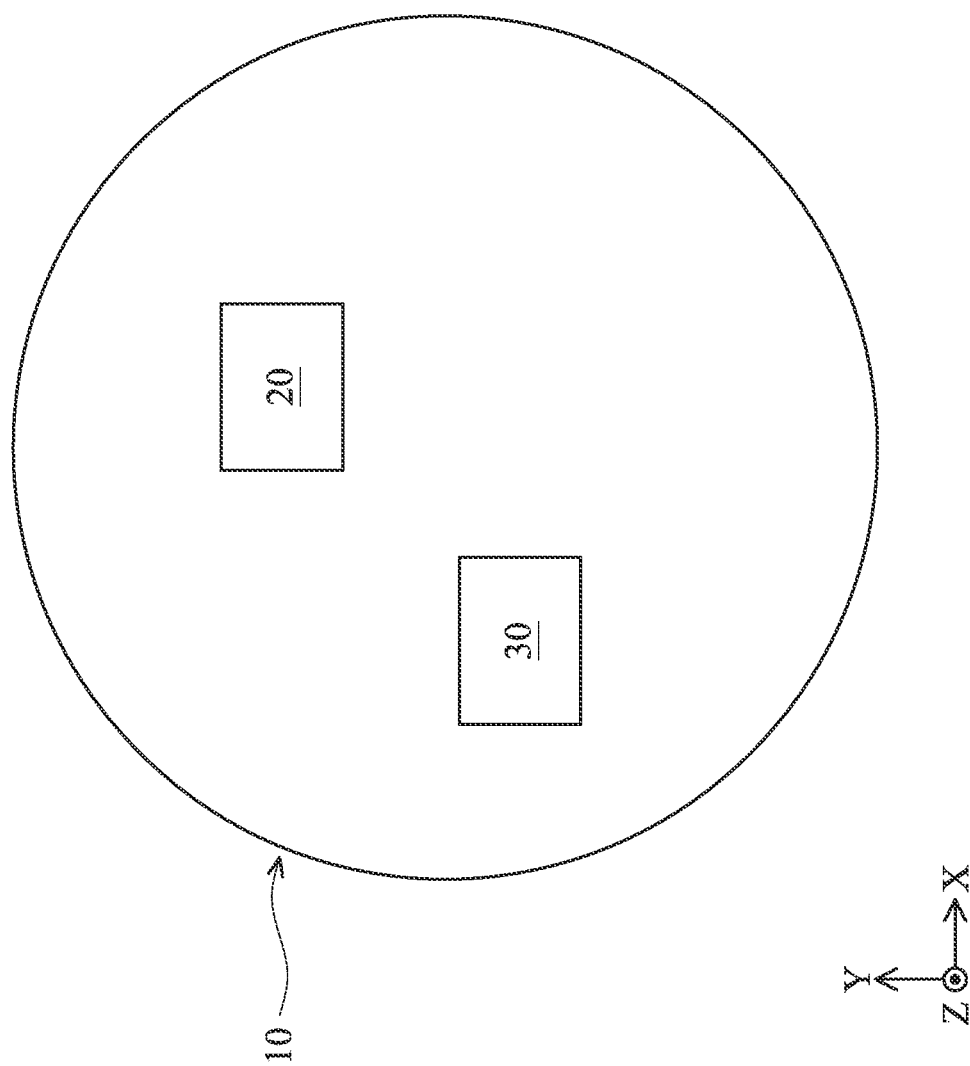
FIG. 1 is a fragmentary diagrammatic top view of an integrated circuit (IC) chip, in portion or entirety, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to layouts and memory structures thereof, and more particularly to layouts and memory structures with field-effect transistors (FETs), such as three-dimensional gate-all-around (GAA) transistors, in an integrated circuit (IC) structure. Generally, a GAA transistor may include a plurality of vertically stacked sheets (e.g., nanosheets), wires (e.g., nanowires), or rods (e.g., nanorods) in a channel region of the transistor, thereby allowing better gate control, lowered leakage current, and improved scaling capability for various IC applications.

The gate-all-around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Static random-access memories (SRAMs) are widely used in portable device applications and/or mobile device applications and are often designed to balance speed of operation (e.g., access time) with power consumption. For example, a high-speed SRAM (i.e., fast access times) may consume more than desired power, while a low-power SRAM may operate slower than desired (e.g., slower access times). Despite rising demand for high-speed, low-power SRAMs with advancing IC technologies, high-speed, low-power SRAMs have been elusive as device densities shrink with scaling IC technology nodes. Such scaling has exacerbated tradeoffs between SRAM speed and SRAM power and introduced challenges to SRAM stability (e.g., read stability and write stability of SRAM cells). As an example, the read stability of an SRAM cell depends on a beta ($\beta$) ratio of the SRAM cell, which refers to a ratio of an on-(drive) current of a pull-down transistor ($I_{on-PD}$) to an on-(drive) current of a pass-gate transistor ($I_{on-PG}$) (i.e., $\beta = I_{on-PD}/I_{on-PG}$). It has been observed that increasing the $\beta$ ratio improves the read stability of the SRAM cell, and since the $\beta$ ratio is proportional to the on-current of the pull-down transistor, the SRAM cell can be designed to increase the on-current of the pull-down transistor, and thus desirably increase the $\beta$ ratio. Assuming the pull-down transistor and the pass-gate transistor have a same channel width, the on-current of a transistor is inversely proportional to a channel length of the transistor (i.e., a shorter channel (and thus a shorter channel length) will drive more current therethrough for a given voltage applied to the transistor), and a channel width of the pull-down transistor can be increased relative to a channel width of the pass-gate transistor to increase the on-current of the pull-down transistor relative to the on-state current of the pass-gate transistor, and thus increase and/or modify the $\beta$ ratio as needed.

Embodiments of the present disclosure offer advantages over the existing art, though it is understood that other embodiments may offer different advantages, not all advantages are necessarily discussed herein, and no particular advantage is required for all embodiments. For example, embodiments discussed herein include layouts, methods, and structures including shrunk gate structures of pull-down transistors used to provide a ratio of the pull-down transistor's effective channel length to the pass-gate's effective channel length that is less than 1, which increases the on-current of the pull-down transistors relative to the on-current of the pass-gate transistors, decreases a threshold voltage of the pull-down transistors relative to a threshold voltage of the pass-gate transistors, and/or increases a $\beta$ ratio of an SRAM cell to greater than 1, thereby improving SRAM performance. The details of the structure and fabrication methods of the present disclosure are described below in conjunction with the accompanying drawings, which illustrate layouts and structures of memory structure with GAA transistors, according to some embodiments.

FIG. 1 is a fragmentary diagrammatic top view of an integrated circuit (IC) chip 10, in portion or entirety, in accordance with some embodiments of the present disclosure. IC chip 10 may include various passive microelectronic devices and active microelectronic devices, such as resistors, capacitors, inductors, diodes, p-type field effect transistors (PFETs), n-type field effect transistors (NFETs), metal-oxide semiconductor field effect transistors (MOSFETs), CMOS transistors, bipolar junction transistors (BJTs), laterally diffused MOS (LDMOS) transistors, high voltage transistors, high frequency transistors, other suitable components, or combinations thereof. The various microelectronic devices can be configured to provide IC chip 10 with functionally distinct regions, such as a core region (also referred to as a logic region), a memory region (e.g., a static random access memory (SRAM) region), an analog region, a peripheral region (also referred to as an input/output (I/O) region), a dummy region, and/or other suitable region. In some embodiments, IC chip 10 includes a memory region 20 and a logic region 30. Memory region 20 can include an array of memory cells, each of which includes transistors and interconnect structures (also referred to as routing structures) that combine to provide a storage device and/or a storage function, such as a flip flop, a latch, other suitable memory devices, or combinations thereof. In some embodiments, memory region 20 is configured with static random-access memory (SRAM) cells, dynamic random-access memory (DRAM) cells, non-volatile random-access memory (NVRAM) cells, flash memory cells, other suitable memory cells, or combinations thereof. Logic region 30 can include an array of standard cells, each of which includes transistors and interconnect structures that combine to provide a logic device and/or a logic function, such as an inverter, an AND gate, an NAND gate, an OR gate, an NOR gate, a NOT gate, an XOR gate, an XNOR gate, other suitable logic devices, or combinations thereof. FIG. 1 has been simplified for the sake of clarity to better understand the inventive concepts of the present disclosure. Additional features can be added in IC chip 10, and some of the features described herein can be replaced, modified, or eliminated in other embodiments of IC chip 10.

Figure 2:
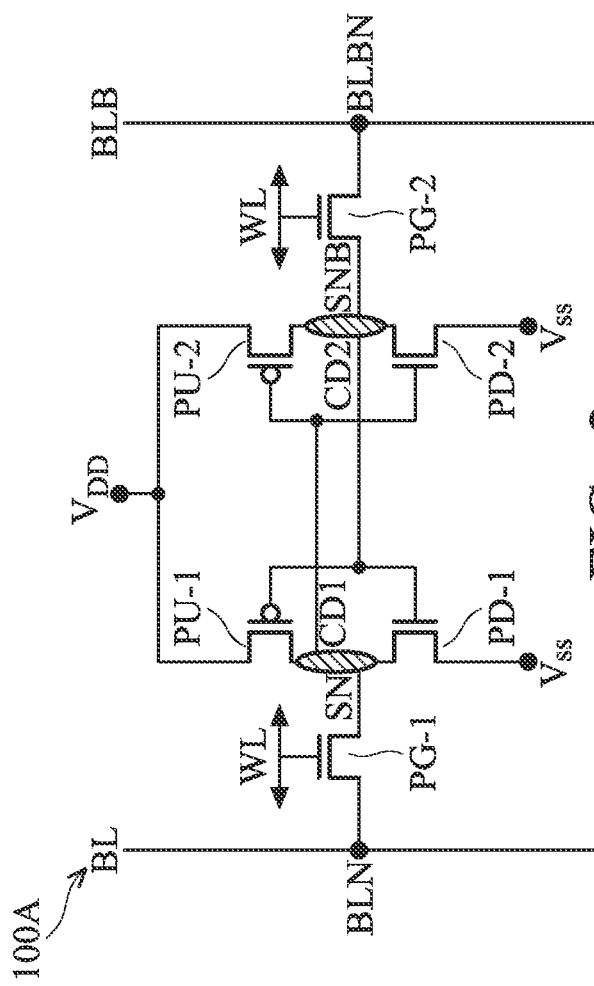
FIG. 2 and FIG. 3 are circuit diagrams of an SRAM circuit that can be implemented in an SRAM cell of a memory device in the memory region of FIG. 1, in accordance with some alternative embodiments of the present disclosure.
Figure 3:
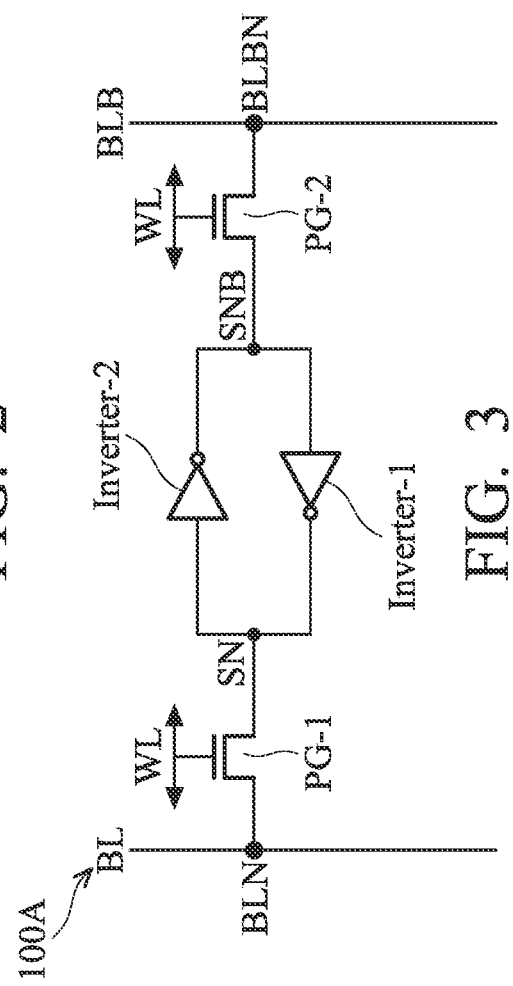

FIG. 2 and FIG. 3 are circuit diagrams of an SRAM circuit that can be implemented in an SRAM cell (e.g., an SRAM cell 100A in FIG. 5) of a memory device in the memory region 20 of FIG. 1, in accordance with some alternative embodiments of the present disclosure. The circuit diagram of SRAM cell is merely exemplary, and in some embodiments, each of SRAM cells (e.g., SRAM cells 100A to 100D in FIGS. 5 and 10) of the memory device is configured with an SRAM circuit similar to the SRAM cell 100A and as shown in FIG. 2 and FIG. 3. For example, each of SRAM cells has a storage portion that includes a cross-coupled pair of inverters (also referred to as a latch), such as an Inverter-1 and an Inverter-2. Inverter-1 includes pull-up transistor PU-1 and pull-down transistor PD-1, and Inverter-2 includes pull-up transistor PU-2 and pull-down transistor PD-2. Pass-gate transistor PG-1 is connected to an output of Inverter-1 and an input of Inveter-2, and pass-gate transistor PG-2 is connected to an output of Inverter-2 and an input of Inverter-1. In operation, pass-gate transistor PG-1 and pass-gate transistor PG-2 provide access to the storage portion of their respective SRAM cell (i.e., Inverter-1 and Invereter-2) and can also be referred to as access transistors of their respective SRAM cell. Each of SRAM cells (e.g., the SRAM cells 100A to 100D in FIGS. 5 and 10) is connected to and powered through a first power supply voltage, such as a positive power supply voltage, and a second power supply voltage, such as a ground voltage or a reference voltage (which can be an electrical ground). A gate of pull-up transistor PU-1 interposes a source, which is electrically coupled to the first power supply voltage via a voltage node (or voltage source) $V_{DD}$, and a first common drain (CD1) (i.e., a drain of pull-up transistor PU-1 and a drain of pull-down transistor PD-1). A gate of pull-down transistor PD-1 interposes a source, which is electrically coupled to the second power supply voltage via a voltage node (or voltage source) $V_{SS}$, and the first common drain. A gate of pull-up transistor PU-2 interposes a source, which is electrically coupled to the first power supply voltage via voltage node $V_{DD}$, and a second common drain (CD-2) (i.e., a drain of pull-up transistor PU-2 and a drain of pull-down transistor PD-2). A gate of pull-down transistor PD-2 interposes a source, which is electrically coupled to the second power supply voltage via voltage node $V_{SS}$, and the second common drain. The first common drain provides a storage node SN that stores data in true form, and the second common drain provides a storage node SNB that stores data in complementary form, or vice versa, in some embodiments. The gate of pull-up transistor PU1 and the gate of pulldown transistor PD-1 are coupled together and to the second common drain SD2, and the gate of pull-up transistor PU-2 and the gate of pull-down transistor PD-2 are coupled together and to the first common drain SD1. A gate of pass-gate transistor PG-1 interposes a drain connected to a bit line node BLN, which is electrically coupled to a bit line BL, and a source, which is electrically coupled to the first common drain SD1. A gate of pass-gate transistor PG-2 interposes a drain connected to a complementary bit line node BLBN, which is electrically coupled to a complementary bit line BLB, and a source, which is electrically coupled to the second common drain SD2. Gates of pass-gate transistors PG-1, PG-2 are connected to and controlled by a word line WL, which allows selection of a respective SRAM cell, such as the SRAM cell 100A, for reading and/or writing. In some embodiments, pass-gate transistors PG-1, PG-2 provide access to storage nodes SN, SNB, respectively, each of which can store a bit (e.g., a logical 0 or a logical 1), during read operations and/or write operations. For example, pass-gate transistors PG-1, PG-2 couple storage nodes SN, SNB, respectively, to bit line BL and bit line bar BLB in response to voltage applied to gates of pass-gate transistors PG-1, PG-2 by word line WL. In some embodiments, SRAM cells are single-port SRAMs. In some embodiments, SRAM cells are configured as multi-port SRAMs, such as dual-port SRAMs, and/or with more or less transistors than depicted, such as 8T SRAMs. FIG. 2 and FIG. 3 have been simplified for the sake of clarity to better understand the inventive concepts of the present disclosure. Additional features can be added in the SRAM circuits of FIG. 2 and FIG. 3, and some of the features described herein can be replaced, modified, or eliminated in other embodiments of the SRAM circuits of FIG. 2 and FIG. 3.

Figure 4:
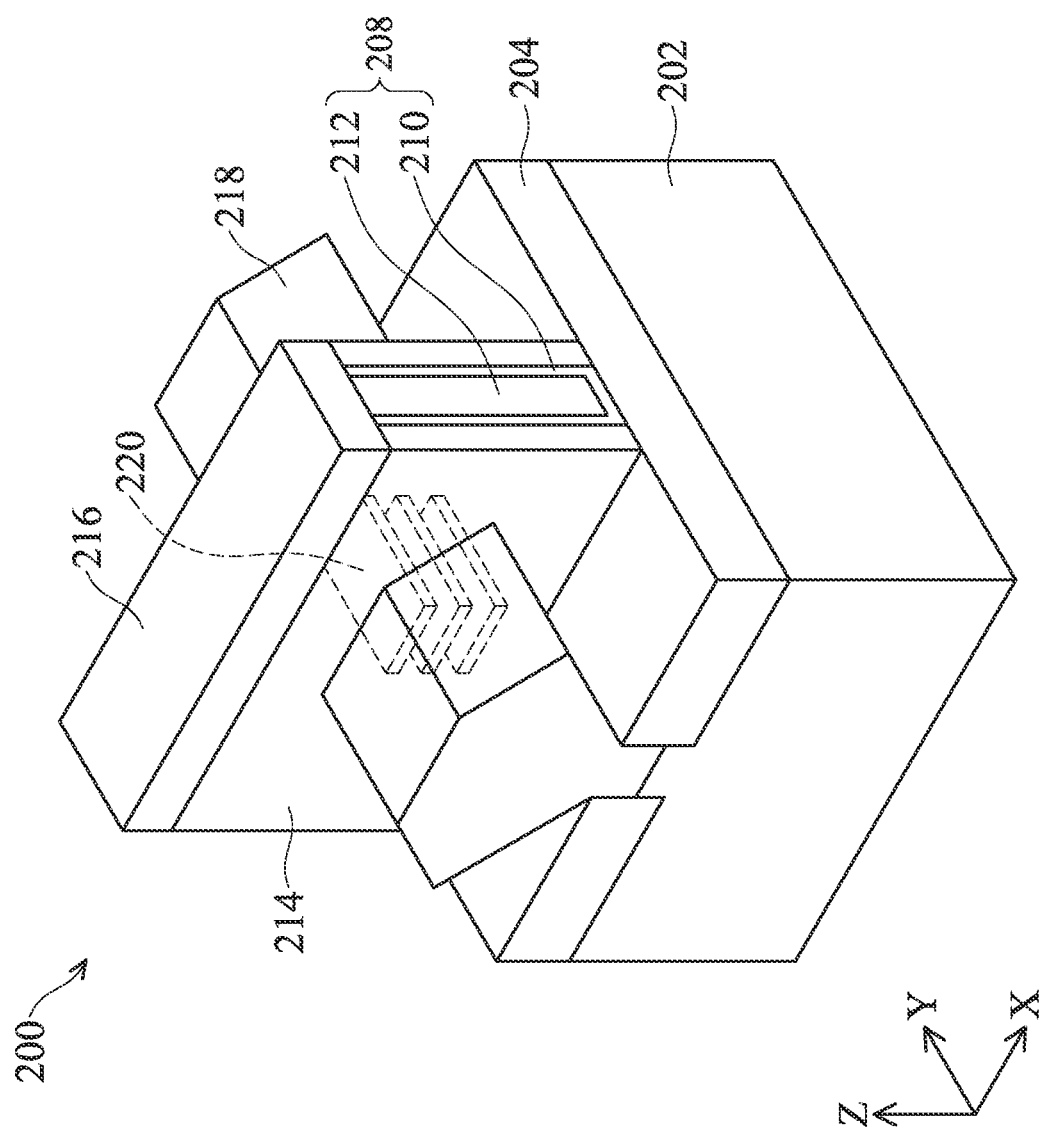
FIG. 4 is a perspective view of an embodiment of a GAA transistor of the present disclosure, in accordance with some embodiments.

Each of the SRAM cells or circuits discussed above is constructed by transistors. The transistors may be planar transistors, fin field-effect transistor (FinFET) transistors, gate-all-around (GAA) transistors, nano-wire transistors, nano-sheet transistors, or a combination thereof. For the sake of providing an example, an exemplary GAA transistor is illustrated in FIG. 4. However, it should be understood that the application should not be limited to a particular type of device, except as specifically claimed.

Referring to FIG. 4, a perspective view of an exemplary GAA transistor 200 is illustrated. The GAA transistor 200 includes a substrate 202. The substrate 202 may contains a semiconductor material, such as bulk silicon (Si). In some other embodiments, the substrate 202 may include other semiconductors such as germanium (Ge), silicon germanium (SiGe), or a III-V semiconductor material. Example III-V semiconductor materials may include gallium arsenide (GaAs), indium phosphide (InP), gallium phosphide (GaP), gallium nitride (GaN), gallium arsenide phosphide (GaAsP), aluminum indium arsenide (AlInAs), aluminum gallium arsenide (AlGaAs), gallium indium phosphide (GaInP), and indium gallium arsenide (InGaAs). The substrate 202 may also include an insulating layer, such as a silicon oxide layer, to have a silicon-on-insulator (SOI) structure or a germanium-on-insulator (GOI) structure.

The GAA transistor 200 also includes one or more nanostructures 220 (dash lines) extending in a Y-direction and vertically arranged (or stacked) in a Z-direction. More specifically, the nanostructures 220 are spaced from each other in the Z-direction. In some embodiments, the nanostructures 220 may also be referred to as channels, channel layers, nanosheets, or nanowires. The nanostructures 220 may include a semiconductor material, such as silicon, germanium, silicon carbide, silicon phosphide, gallium arsenide, gallium phosphide, indium phosphide, indium arsenide, and/or indium antimonide, silicon germanium (SiGe), SiPC, GaAsP, AlInAs, AlGaAs, GaInAs, GaInP, and/or GaInAsP. In some embodiments, the nanostructures 220 include silicon for N-type GAA transistors. In other embodiments, the nanostructures 220 include silicon germanium for P-type GAA transistors. In some embodiments, the nanostructures 220 are all made of silicon, and the type of GAA transistors depend on work function metal layer wrapping around the nanostructures 220.

The GAA transistor 200 further includes a gate structure 208 including a gate electrode 212 and a gate dielectric layer 210. The gate dielectric layer 210 wraps around the nanostructures 220 and the gate electrode 212 wraps around the gate dielectric layer 210 (not shown in FIG. 2, may refer to FIGS. 6B and 6D). The gate electrode 212 may include polysilicon or work function metal. The work function metal includes TiN, TaN, TiAl, TiAlN, TaAl, TaAlN, TaAlC, TaCN, WNC, Co, Ni, Pt, W, combinations thereof, or other suitable material.

In some embodiments, the gate electrode 212 may include a capping layer, a barrier layer, an n-type work function metal layer, a p-type work function metal layer, and a fill material (not shown).

The gate dielectric layer 210 may include dielectric materials, such as silicon oxide, silicon nitride, silicon oxynitride, dielectric material(s) with high dielectric constant (high-k), or a combination thereof. Examples of high-k dielectric materials include $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material.

Figure 6A:
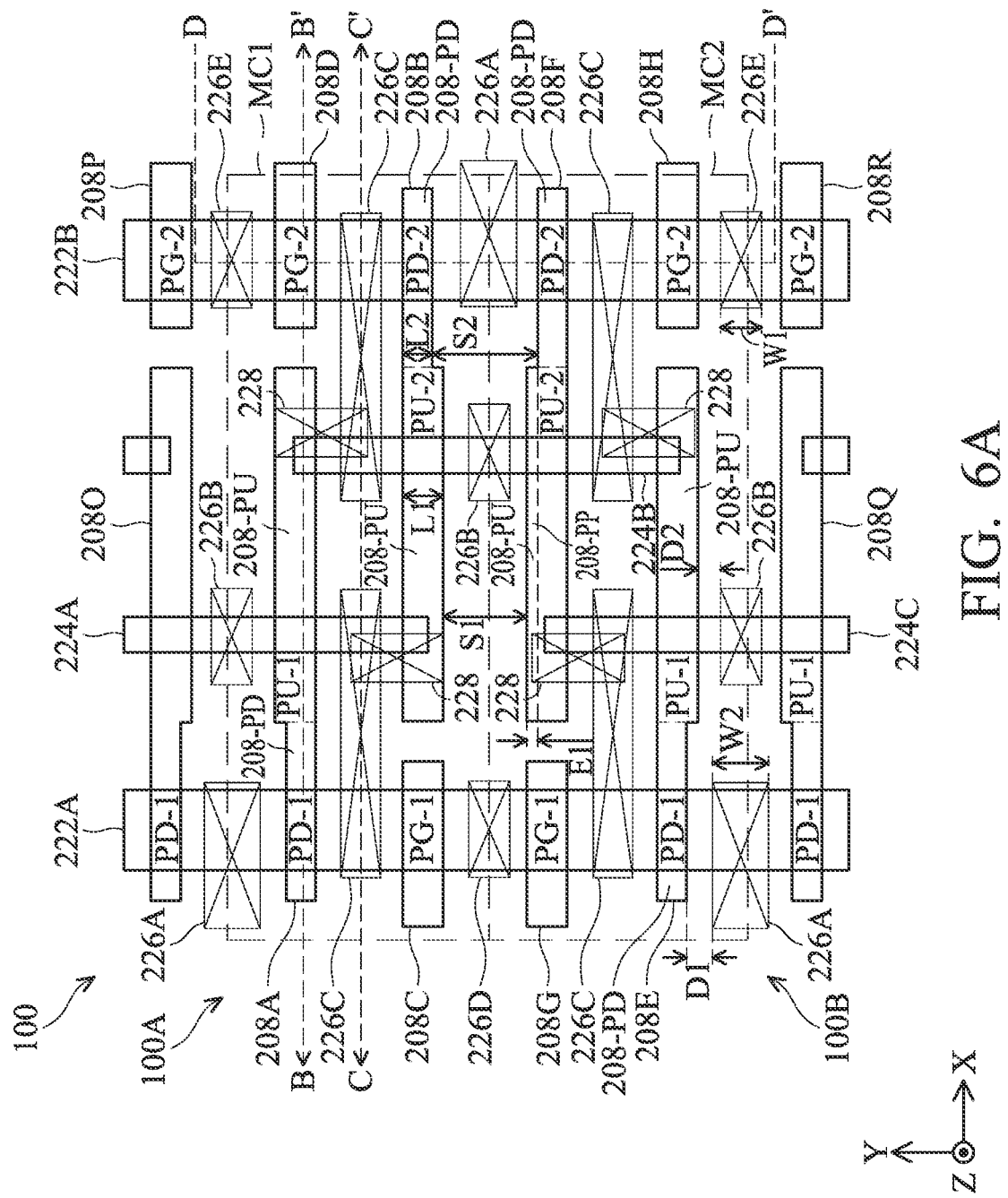
FIG. 6A is a fragmentary diagrammatic top view of a portion of a layout of an SRAM array, in accordance with some embodiments of the present disclosure.
Figure 6B:
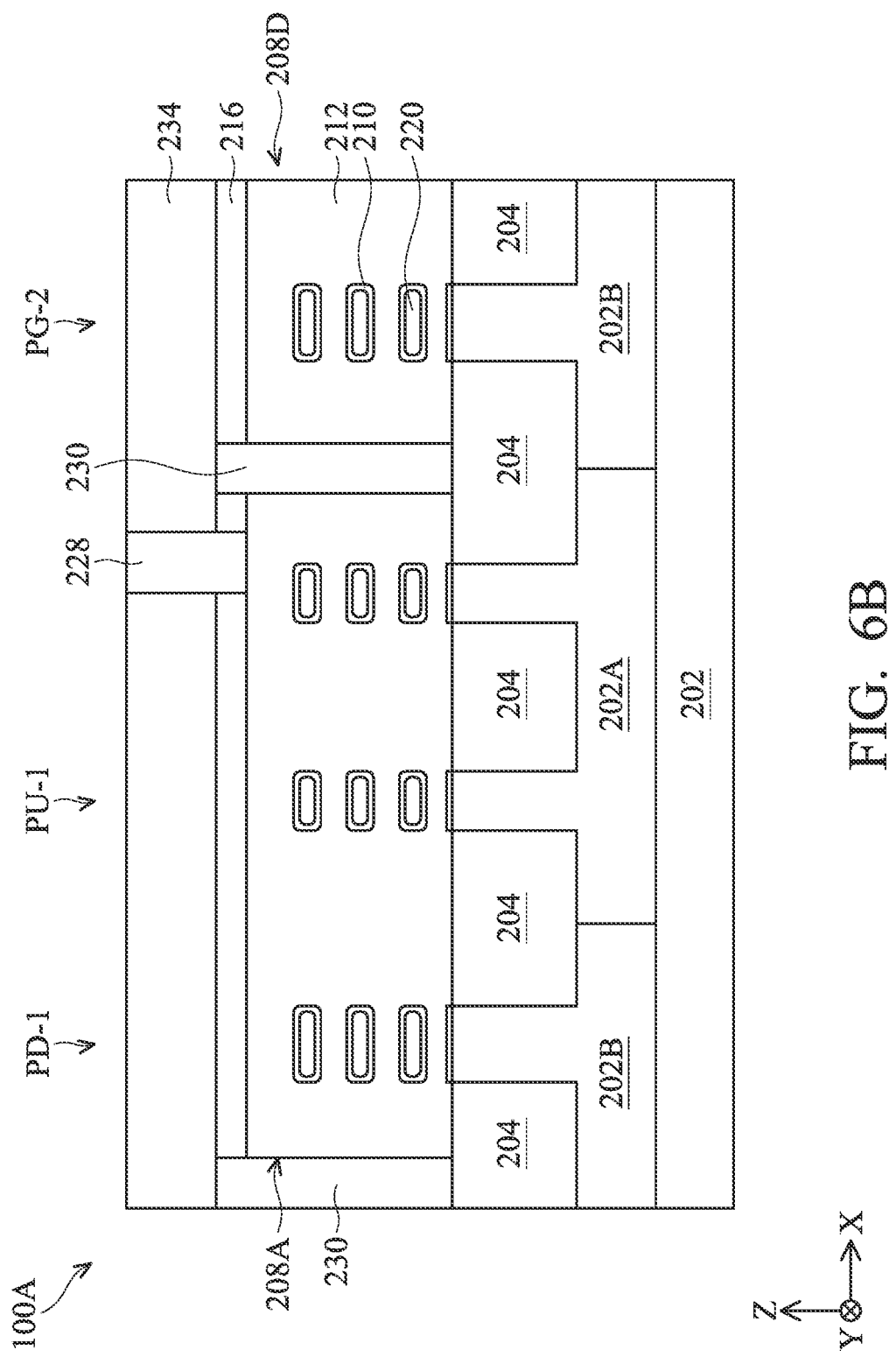
FIG. 6B is a diagrammatic cross-sectional view of an SRAM cell of the SRAM array along line B-B' of FIG. 6A, in accordance with some embodiments of the present disclosure.
Figure 6C:
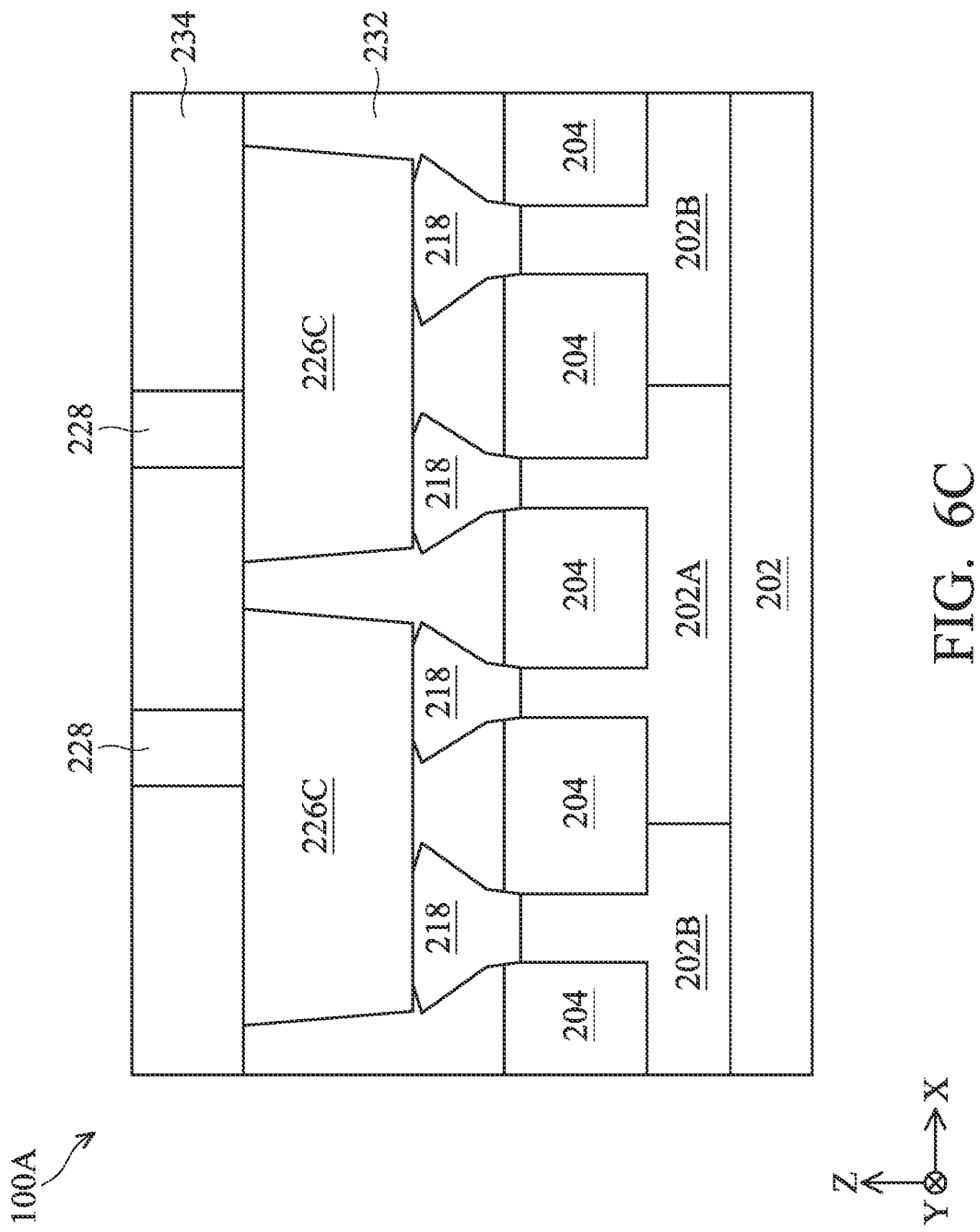
FIG. 6C is a diagrammatic cross-sectional view of an SRAM cell of the SRAM array along line C-C' of FIG. 6A, in accordance with some embodiments of the present disclosure.
Figure 6D:
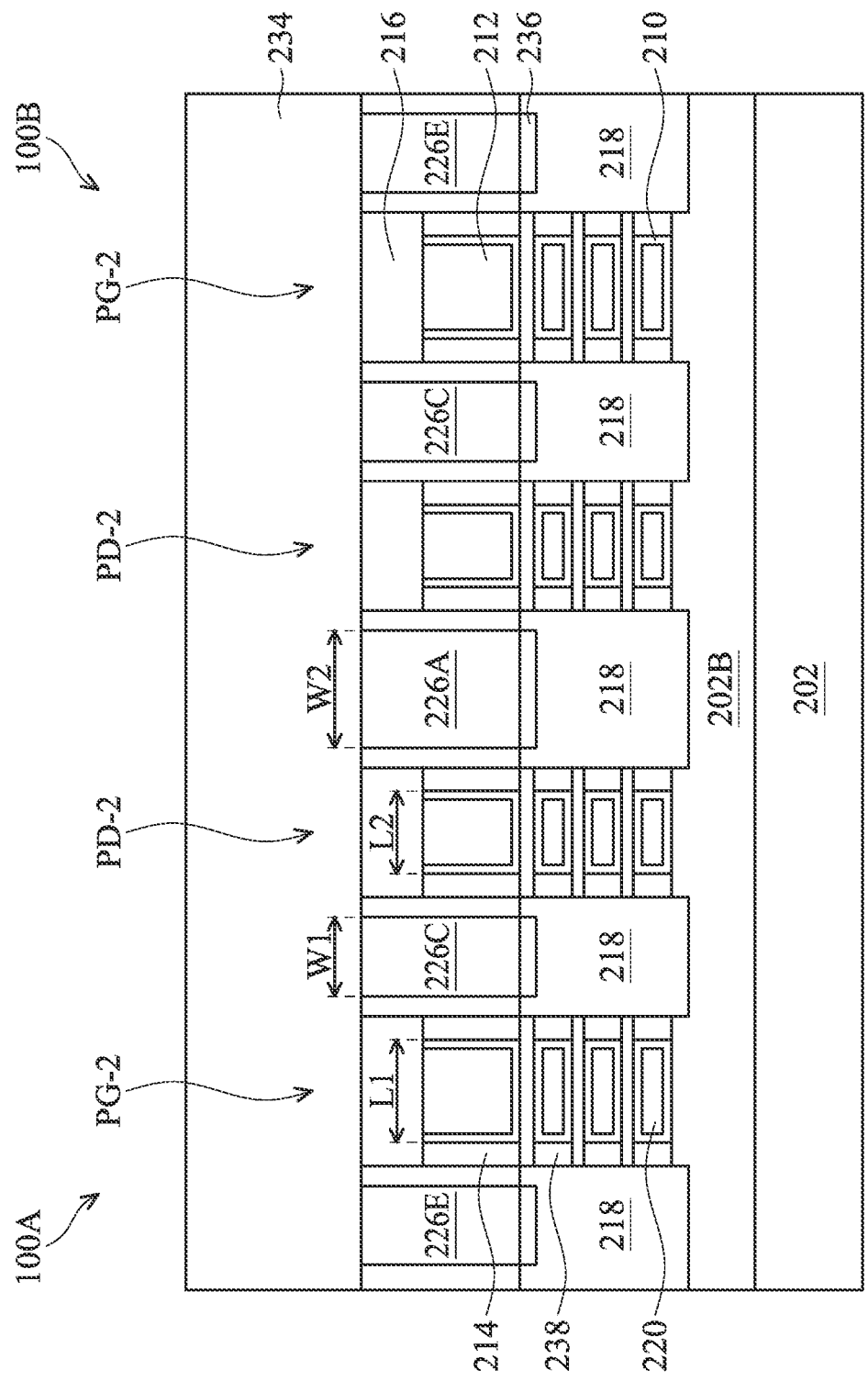
FIG. 6D is a diagrammatic cross-sectional view of SRAM cells of the SRAM array along line D-D' of FIG. 6A, in accordance with some embodiments of the present disclosure.

As shown in FIG. 4, gate spacers 214 are on sidewalls of the gate dielectric layer 210 and over the nanostructures 220 (not shown in FIG. 2, may refer to FIG. 6D). The gate spacers 214 may include multiple dielectric materials and be selected from a group consisting of silicon nitride ($Si_3N_4$), silicon oxide ($SiO_2$), silicon carbide (SiC), silicon oxycarbide (SiOC), silicon oxynitride (SiON), silicon oxycarbon nitride (SiOCN), carbon doped oxide, nitrogen doped oxide, porous oxide, air gap, or a combination thereof. In some embodiments, the gate spacers 214 may include a single layer or a multi-layer structure.

The gate top dielectric layer 216 is over the gate dielectric layer 210, the gate electrode 212, and the nanostructures 220. The gate top dielectric layer 216 is used for contact etch stop layer. The material of gate top dielectric layer 216 is selected from a group consisting of oxide, SiOC, SiON, SiOCN, nitride base dielectric, metal oxide dielectric, Hf oxide ($HfO_2$), Ta oxide ($Ta_2O_5$), Ti oxide ($TiO_2$), Zr oxide (ZrO$_2$), Al oxide (Al$_2$O$_3$), Y oxide (Y$_2$O$_3$), combinations thereof, or other suitable material.

The GAA transistor 200 further includes source/drain features 218. The nanostructures 220 (dash lines) extends in the Y-direction to connect two source/drain features 218. As shown in FIG. 2, two source/drain features 218 are on opposite sides of the gate structure. The source/drain features 218 may also be referred to as source/drain or source/drain regions. In some embodiments, for an N-type GAA transistor, the source/drain features 218 may include SiP, SiC, SiPC, SiAs, Si, or a combination thereof. In some embodiments, for a P-type GAA transistor, the source/drain features 218 may include SiGe, SiGeC, Ge, Si, a boron-doped SiGe, boron and carbon doped SiGe, or a combination thereof.

Isolation feature 204 is over the substrate 202 and under the gate dielectric layer 210, the gate electrode 212, and the gate spacers 214. The isolation feature 204 is used for isolating the GAA transistor 200 from other devices. In some embodiments, the isolation feature 204 may include different structures, such as shallow trench isolation (STI) structure, deep trench isolation (DTI) structure. Therefore, the isolation feature 204 is also referred as to as a STI feature or DTI feature.

Figure 5:
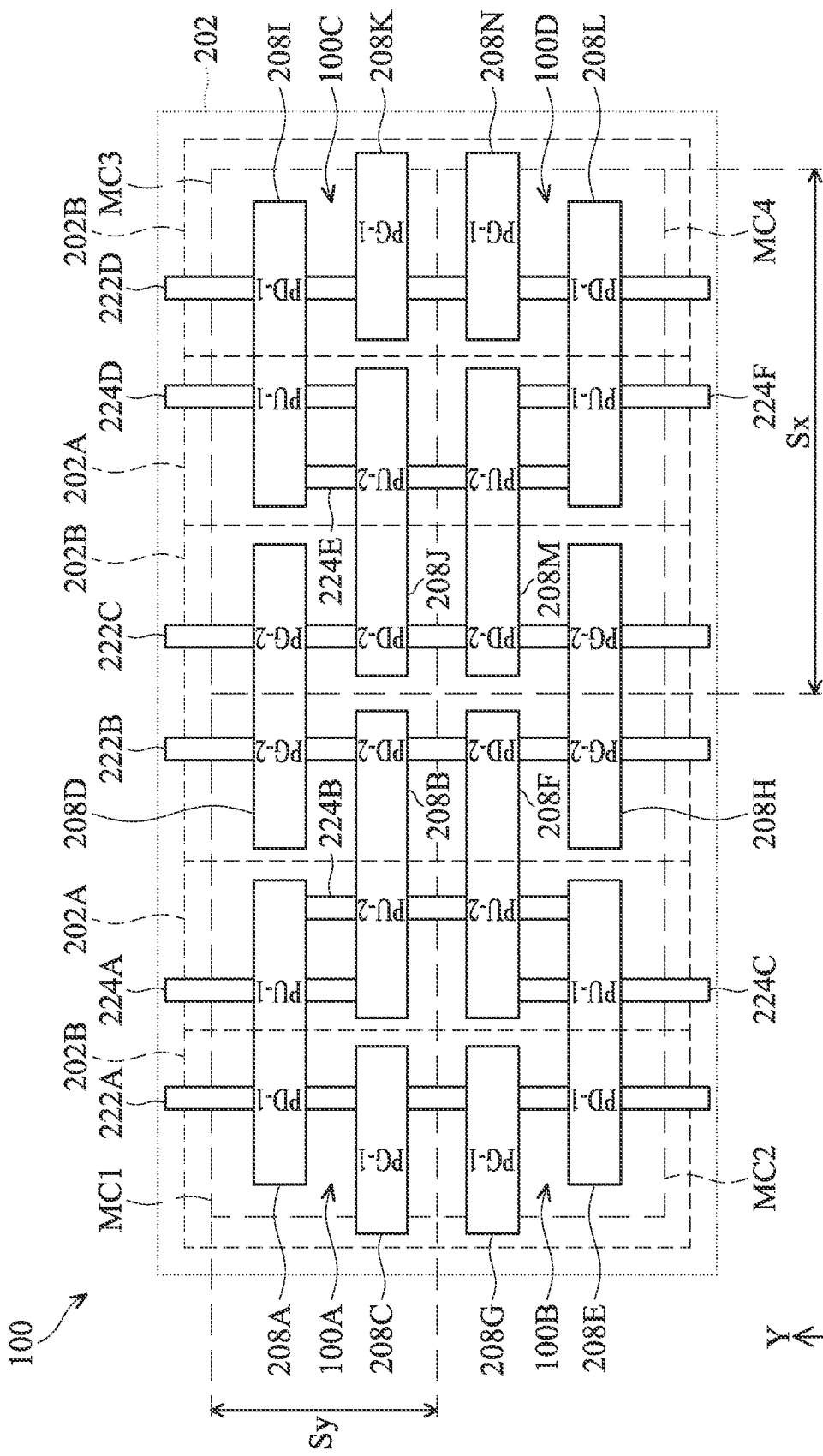
FIG. 5 is a fragmentary diagrammatic top view of an SRAM array, in portion or entirety, that can be incorporated into IC chip of FIG. 1, in accordance with some embodiments of the present disclosure.

FIG. 5 is a fragmentary diagrammatic top view of an SRAM array, such as an SRAM array 100, in portion or entirety, that can be incorporated into IC chip 10 of FIG. 1, in accordance with some embodiments of the present disclosure. In some embodiments, memory region 20 of IC chip 10 includes the SRAM array 100. In FIG. 5, the SRAM array 100 includes an SRAM cell 100A having a cell boundary MC1, an SRAM cell 100B having a cell boundary MC2, an SRAM cell 100C having a cell boundary MC3, and an SRAM cell 100D having a cell boundary MC4. In some embodiments, cell boundaries MC1 to MC4 have substantially the same size, such as a cell width $S_X$, in a first direction (e.g., X-pitch in a X-direction) and a cell height $S_Y$, in a second direction (e.g., Y-pitch in the Y-direction) perpendicular to the first direction. In some embodiments, the cell width $S_X$ is greater than the cell height $S_Y$. For example, a ratio of the cell width $S_X$ to the cell height $S_Y$ is greater than one. The SRAM cells 100A to 100D are arranged in a two-by-two array (or grid), where a layout of an SRAM cell is repeated in the SRAM array 100, such that the SRAM cells 100A to 100D exhibit mirror symmetry and/or rotational symmetry with respect to each other. For example, using the SRAM cell 100A as a reference, a layout of SRAM cell 100B is a mirror image of a layout of the SRAM cell 100A with respect to an axis along the first direction (i.e., X-axis), a layout of SRAM cell 100C is a mirror image of the layout of SRAM cell 100A with respect to an axis along the second direction (i.e., Y-axis), and a layout of SRAM cell 100D is a mirror image of the layout of SRAM cell 100B along the axis along the second direction. Put another way, the layout of SRAM cell 100D is symmetric to the layout of SRAM cell 100A by a rotation of 180 degrees about a geometric center of the grid, which can generally refer to an intersection point of an imaginary reference line bisecting the grid (array) along the Y-axis and an imaginary reference line bisecting the grid along the X-axis. In some embodiments, cell width $S_X$ can represent and be referred to as a memory cell pitch of the SRAM array 100 in the first direction and cell height SY can represent and be referred to as a memory cell pitch of the SRAM array 100 in the second direction. In some embodiments, the SRAM cells 100A to 100D are configured for similar applications, such as high-speed applications, low-power applications, super high-speed applications, other suitable applications, or combinations thereof, and/or with the same specifications, such as physical characteristics (e.g., dimensions, layouts, etc.) and/or electrical characteristics (e.g., threshold voltages, on-current ($I_{on}$), read voltages, write voltages, etc.). In some embodiments, the SRAM cells 100A to 100D are configured for different applications and/or with different specifications. FIG. 5 has been simplified for the sake of clarity to better understand the inventive concepts of the present disclosure. For example, FIG. 5 shows well regions, active areas, and gate structures of the SRAM array 100 without other features (e.g., contacts) and shapes of the features are simplified into rectangle shapes instead of the improved shapes discussed in the present disclosure. Additional features can be added in the SRAM array 100, and some of the features described herein can be replaced, modified, or eliminated in other embodiments of SRAM array 100.

Referring to FIG. 5, SRAM array 100 includes the substrate (wafer) 202 discussed above and having n-type doped regions, such as n-wells 202A, and p-type doped regions, such as p-wells 202B, disposed therein. In some embodiments, each of SRAM cells 100A to 100D includes a portion of the substrate 202 having a respective n-well 202A disposed between a respective pair of p-wells 202B. The n-wells 202A are doped with n-type dopants, such as phosphorus, arsenic, other n-type dopant, or combinations thereof. The p-wells 202B are doped with p-type dopants, such as boron, indium, other p-type dopant, or combinations thereof. In some embodiments, the substrate 202 includes doped regions formed with a combination of p-type dopants and n-type dopants. The various n-type doped regions and/or p-type doped regions can be formed directly on and/or in the substrate 202, for example, providing a p-well structure, an n-well structure, a dual-well structure, a raised structure, or combinations thereof.

The SRAM array 100 further includes active areas, each of which includes channel regions, source regions, and drain regions (where source regions and drain regions are collectively referred to as source/drain regions herein) of transistors (e.g., the GAA transistor 200) of the SRAM array 100. For example, the SRAM array 100 includes an n-type active area 224A, an n-type active area 224B, an n-type active area 224C, an n-type active area 224D, an n-type active area 224E, and an n-type active area 224F disposed over the n-wells 202A. SRAM array 100 further includes a p-type active area 222A, a p-type active area 222B, a p-type active area 222C, and a p-type active area 222D disposed over the p-wells 202B. The n-type active areas 224A to 224F and the p-type active areas 222A to 222D are oriented substantially parallel to each another, extend lengthwise in the second direction (i.e., length is in the second direction, width is in the first direction, and height is in a third direction (e.g., the Z-direction) perpendicular to the first direction and the second direction), and are separated from each other in the first direction. As shown in FIG. 5, each of the SRAM cells 100A to 100D has four active areas arranged in the first direction. For example, the SRAM cell 100A has the p-type active area 222A, the n-type active area 224A, the n-type active area 224B, and the p-type active area 222B arranged in the first direction. Furthermore, the p-type active areas 222A to 222D are shared by the SRAM cells in the same column of the SRAM array 100. More specifically, the p-type active areas 222A and 222B are shared by the SRAM cells 100A and 100B in the same column, and the 222C and 222D are shared by the SRAM cells 100C and 100D in the same column.

In some embodiments, the n-type active areas 224A to 224F and p-type active areas 222A to 222D are GAA-based active areas, where channel regions thereof are formed by vertically stacked nanostructures, suspended over substrate 202 (i.e., the nanostructures do not physically contact substrate 202), and source/drain regions thereof are formed by p-type source/drain features or n-type source/drain features, respectively. In such embodiments, the vertically stacked nanostructures are disposed between respective p-type source/drain features to provide channel regions and source/drain regions of p-type GAA FETs, and the vertically stacked nanostructures are disposed between respective n-type source/drain features to provide channel regions and source/drain regions of n-type GAA FETs. Furthermore, each vertical stack of nanostructures is disposed over a respective extension portion of substrate 202, which can be referred to as a substrate extension, a mesa (or mesa structure), a fin, etc.

The SRAM array 100 further includes gate structures, such as a gate structure 208A to 208N (may be collectively referred to as the gate structures 208 discussed above). The gate structures 208A to 208N are oriented substantially parallel to one another, extend lengthwise in the first direction, and are separated from each other in the second direction. The gate structures 208A to 208N are disposed over the channel regions of the respective n-type active areas 224A to 224F and/or the respective p-type active areas 222A to 222D (i.e., the (vertically stacked) nanostructures) and disposed between respective source/drain regions of n-type active areas 224A to 224F and/or p-type active areas 222A to 222D (i.e., p-type source/drain features and/or n-type source/drain features, respectively). In some embodiments, gate structures 208A to 208N wrap and/or surround suspended, vertically stacked nanostructures of the n-type active areas 224A to 224F and the p-type active areas 222A to 222D, respectively (shown in FIGS. 6B and 6D).

The n-type active areas 224A to 224F, the p-type active areas 222A to 222D, and the gate structures 208A to 208N are configured to provide each of SRAM cells 100A to 100D with six transistors: a pull-down (PD) transistor PD-1, a pull-up (PU) transistor PU-1, a pull-down transistor PD-2, a pull-up transistor PU-2, a pass-gate (PG) transistor PG-1, and a pass-gate transistor PG-2, as shown in FIG. 5. The SRAM cells 100A to 100D can alternatively referred to as 6T SRAMs.

In the SRAM cell 100A, the gate structure 208A engages the n-type active area 224A to construct the pull-up transistor PU-1, the gate structure 208B engages the n-type active area 224B to construct the pull-up transistor PU-2, the gate structure 208A engages the p-type active area 222A to construct the pull-down transistor PD-1, the gate structure 208B engages the p-type active area 222B to construct the pull-down transistor PD-2, the gate structure 208C engages the p-type active area 222A to construct the pass-gate transistor PG-1, and the gate structure 208D engages the p-type active area 222B to construct the pass-gate transistor PG-2.

In the SRAM cell 100B, the gate structure 208E engages the n-type active area 224C to construct the pull-up transistor PU-1, the gate structure 208F engages the n-type active area 224B to construct the pull-up transistor PU-2, the gate structure 208E engages the p-type active area 222A to construct the pull-down transistor PD-1, the gate structure 208F engages the p-type active area 222B to construct the pull-down transistor PD-2, the gate structure 208G engages the p-type active area 222A to construct the pass-gate transistor PG-1, and the gate structure 208H engages the p-type active area 222B to construct the pass-gate transistor PG-2.

In the SRAM cell 100C, the gate structure 208I engages the n-type active area 224D to construct the pull-up transistor PU-1, the gate structure 208J engages the n-type active area 224E to construct the pull-up transistor PU-2, the gate structure 208I engages the p-type active area 222D to construct the pull-down transistor PD-1, the gate structure 208J engages the p-type active area 222C to construct the pull-down transistor PD-2, the gate structure 208K engages the p-type active area 222D to construct the pass-gate transistor PG-1, and the gate structure 208D engages the p-type active area 222C to construct the pass-gate transistor PG-2.

In the SRAM cell 100D, the gate structure 208L engages the n-type active area 224F to construct the pull-up transistor PU-1, the gate structure 208M engages the n-type active area 224E to construct the pull-up transistor PU-2, the gate structure 208L engages the p-type active area 222D to construct the pull-down transistor PD-1, the gate structure 208M engages the p-type active area 222C to construct the pull-down transistor PD-2, the gate structure 208N engages the p-type active area 222D to construct the pass-gate transistor PG-1, and the gate structure 208H engages the p-type active area 222C to construct the pass-gate transistor PG-2.

In some embodiments, the pull-up transistor PU-1 and the pull-up transistor PU-2 are p-type GAA transistors, and the pull-down transistor PD-1, the pull-down transistor PD-2, the pass-gate transistor PG-1, and the pass-gate transistor PG-2 are n-type GAA transistors.

Each of the SRAM cells 100A to 100D thus includes a respective pull-down transistor PD-1 and a respective pull-up transistor PU-1 that share a gate structure (e.g., in the SRAM cell 100A, the pull-down transistor PD-1 and the pull-up transistor PU-1 share the gate structure 208A), and a respective pull-down transistor PD-2 and a respective pull-up transistor PU-2 that share a gate structure (e.g., in SRAM cell 100A, the pull-down transistor PD-2 and the pull-up transistor PU-2 share the gate structure 208B). Thus, in some embodiments, the gate structures 208A, 208B, 208E, 208F, 208I, 208J, 208L, and 208M may also be referred to as shared gate structures. In some embodiments, the SRAM cells in the SRAM array 100 in the same row share a gate structure for pass-gate transistors. Specifically, the SRAM cells 100A and 100C in the same row share the gate structure 208D for the pass-gate transistors PG2 of the SRAM cells 100A and 100C, and the SRAM cells 100B and 100D in the same row share the gate structure 208H for the pass-gate transistors PG2 of the SRAM cells 100B and 100D. Thus, in some embodiments, the gate structures 208C, 208D, 208G, 208H, 208K, and 208N may also be referred to as shared gate structures.

Still referring to FIG. 5, pull-down transistors and pass-gate transistors may share active areas, and pull-up transistors may share active areas. For example, the pass-gate transistor PG-1 and the pull-down transistor PD-1 of the SRAM cell 100A and the pass-gate transistor PG-1 and the pull-down transistor PD-1 of the SRAM cell 100B are arranged in the second direction to share the p-type active area 222A; the pass-gate transistor PG-2 and the pull-down transistor PD-2 of the SRAM cell 100A and the pass-gate transistor PG-1 and the pull-down transistor PD-1 of the SRAM cell 100B are arranged in the second direction to share the p-type active area 222B; the pass-gate transistor PG-2 and the pull-down transistor PD-2 of the SRAM cell 100C and the pass-gate transistor PG-1 and the pull-down transistor PD-1 of the SRAM cell 100D are arranged in the second direction to share the p-type active area 222C; and the pass-gate transistor PG-1 and the pull-down transistor PD-1 of the SRAM cell 100C and the pass-gate transistor PG-1 and the pull-down transistor PD-1 of the SRAM cell 100D are arranged in the second direction to share the p-type active area 222D.

The pull-up transistor PU-2 of the SRAM cell 100A and the pull-up transistor PU-2 of the SRAM cell 100B share the n-type active area 224B, and the pull-up transistor PU-2 of the SRAM cell 100C and the pull-up transistor PU-2 of the SRAM cell 100D share the n-type active area 224B. The pull-up transistor PU-1 of the SRAM cell 100A, the pull-up transistor PU-1 of the SRAM cell 100B, the pull-up transistor PU-1 of the SRAM cell 100C, and/or the pull-up transistor PU-1 of the SRAM cell 100D share, respectively, the n-type active area 224A, the n-type active area 224C, the n-type active area 224D, and/or the n-type active area 224F with a pull-up transistor PU-1 of an SRAM cell directly above or below (in top view of FIG. 5) a respective one of SRAM cells 100A to 100D. Therefore, in some embodiments, the p-type active areas 222A to 222D and the n-type active areas 224A to 224F may also be referred to as shared active areas. In FIG. 5, each of SRAM cells 100A to 100B has two n-type active areas (e.g., the n-type active area 224A and the n-type active area 224B of SRAM cell 100A) disposed between two p-type active areas (e.g., the p-type active area 222A and the p-type active area 222B of SRAM cell 100A) in the first direction.

As noted above, readability of an SRAM cell, such as any of the SRAM cells 100A to 100D, depends on a β ratio of the SRAM cell, which is a ratio of an on-current of a pull-down transistor ($I_{on\text{-}PD}$) to an on-current of a pass-gate transistor ($I_{on\text{-}PG}$) (i.e., $\beta = I_{on\text{-}PD}/I_{on\text{-}PG}$). To enhance the β ratio, the present disclosure proposes a SRAM layout where pull-down transistors and pass-gate transistors of an SRAM cell have a same channel width, so that a ratio of an effective channel length of the pass-gate transistors to an effective channel length of the pull-down transistors correspond with the β ratio. Accordingly, the β ratio of the SRAM cell can be optimized by decreasing or shrinking a length of gate structures (i.e., gate length) that correspond with the pull-down transistors relative to a length of gate structures that correspond with the pass-gate transistors, which results in corresponding decreases in a channel length (and on-current) of the pull-down transistors relative to a channel length (and on-current) of the pass-gate transistors, thereby tuning (for example, increasing) the β ratio of the SRAM cell simply by adjusting lengths of gate structures (and corresponding effective channel lengths) of the pull-down transistors. The gate length adjustments disclosed herein also allow for threshold voltage tuning of the pull-down transistors and/or the pass-gate transistors to further optimize SRAM performance, for example, by improving SRAM read margins. The SRAM layout further provides SRAM cells with tunable effective channel length ratios, such as a ratio of a pull-down effective channel length to a pass-gate effective channel length that is less than 1.

FIG. 6A is a fragmentary diagrammatic top view of a portion of a layout of an SRAM array, such as a portion of the SRAM array 100 that can be implemented to improve SRAM performance, in accordance with some embodiments of the present disclosure. FIG. 6B is a diagrammatic cross-sectional view of the SRAM cell 100A of the SRAM array 100 along line B-B' of FIG. 6A, in accordance with some embodiments of the present disclosure. FIG. 6C is a diagrammatic cross-sectional view of the SRAM cell 100A of the SRAM array 100 along line C-C' of FIG. 6A, in accordance with some embodiments of the present disclosure. FIG. 6D is a diagrammatic cross-sectional view of the SRAM cells 100A and 100B of the SRAM array 100 along line D-D' of FIG. 6A, in accordance with some embodiments of the present disclosure.

Referring to FIG. 6A, the p-type active areas 222A and 222B, the n-type active areas 224A to 224C, and the gate structures 208A to 208H of the SRAM cells 100A and 100B discussed above are shown together with source/drain contacts 226A to 226E and butted contacts 228. For clarity, the FIG. 6A further shows gate structures 208O and 208P of a SRAM cell adjacent to the SRAM cell 100A in the second direction and gate structures 208O and 208P of a SRAM cell adjacent to the SRAM cell 100B in the second direction. To improve SRAM performance, the present disclosure proposes modifying a layout of SRAM array to shrink a gate length of gate structures for pull-down transistors of SRAM cells that increase a β ratio of SRAM cells and/or decrease a threshold voltage of pull-down transistors of SRAM cells. Specifically, the gate structures of the SRAM cells in the SRAM array originally have a gate length in the second direction. Then, the gate length of portions of the gate structures of the pull-down transistors is shrunk with respect to the gate length of portions of the gate structures of the pull-up transistors and the gate length of the gate structures of the pass-gate transistors. For example, in FIG. 6A to 6D, the gate structures 208A, 208B, 208E, and 208F each has a pull-down (PD) portion 208-PD that corresponds with the pull-down transistor PD-1 or the pull-down transistor PD-2, and a pull-up (PU) portion 208-PU that corresponds with the pull-up transistor PU-1 or the pull-down transistor PU-2. The PU portions 208-PU of the gate structures 208A, 208B, 208E, and 208F and the gate structures 208C, 208D, 208G, and 208H have a dimension L1 in the second direction (i.e., an original gate length). The PD portion 208-PD of the gate structures 208A, 208B, 208E, and 208F have a dimension L2 (i.e., shrunk gate length) in the second direction shrunk from the dimension L1. The dimension L1 is greater than the dimension L2. In some embodiments, the dimension L1 is in a range from about 10 nm to about 15 nm. In some embodiments, the dimension L2 is in a range from about 6 nm to about 14 nm. In some aspects, such shrink for the PD portions 208-PD of the gate structures 208A, 208B, 208E, and 208F cause the PU portions 208-PU of each of the gate structures 208A, 208B, 208E, and 208F to have a protrusion portion 208-PP (labeled at the PU portion 208-PU of the gate structure 208-F and omit other label of the protrusion portions 208-PP for simplicity). The protrusion portion 208-PP has a dimension E1 in the second direction that is in a range from about 1 nm to about 4 nm. The dimension L1 is a sum of the dimension L2 and the dimension E1. Such structures may also be referred to as jogs. Shrink of the PD portions 208-PD is tuned to provide a ratio of the dimension L2 to the dimension L1 that is less than 1. In some embodiments, the ratio of the dimension L1 to the dimension L2 is about 1.1 to about 1.5.

As shown in FIGS. 6A and 6B, the pass-gate transistors (PG-1, PG-2) and the pull-down transistors (PD-1, PD-2) share the same active area (222A, 222B). This means that the pass-gate transistors (PG-1, PG-2) and the pull-down transistors (PD-1, PD-2) have the same channel width (a dimension of the active area (222A, 222B) in the first direction shown in FIG. 6A or a dimension of the nanostructures 220 in the first direction shown in FIG. 6B). Therefore, the β beta ratio of the SRAM cell is tuned by effective channel length in the present disclosure. Specifically, shrink of the gate length (the dimension L2) of the PD portions (208-PD) relative to the gate length (the dimension L1) of the pass-gate transistor (PG-1, PG-2) provides shrink of an effective channel length of pull-down transistors relative to an effective channel length of pass-gate transistors. For example, in FIG. 6D, the effective channel lengths of the nanostructures 220 of the pull-down transistors PD-2 and pass-gate transistors PG-2 also have the dimension L2 and L1, respectively. The dimension L1 is greater than the dimension L2. The shorter effective channel lengths (the dimension L2) of the pull-down transistors (PD-1, PD-2) relative to the effective channel lengths (the dimension L1) of the pass-gate transistors (PG-1, PG-2) provides that a threshold voltage of the pull-down transistors (PD-1, PD-2) is less than a threshold voltage of the pass-gate transistors (PG-1, PG-2), thereby the on-current of the pull-down transistors (PD-1, PD-2) is greater than the on-current of the pass-gate transistors (PG-1, PG-2).

Accordingly, the gate length of PD portions 208-PD can be tuned to optimize a β ratio ($I_{on-PD}/I_{on-PG}$) of pull-down transistors to pass-gate transistors of SRAM array 100. For example, the dimension L2 is shrunk relative to the dimension L1 to provide PD/PG transistor pairs of the SRAM cell 100A and/or the SRAM cell 100B with β ratios that are greater than 1 (i.e., β>1) which improves read stability and overall performance of the SRAM cell 100A and/or the SRAM cell 100B. In some embodiments, β ratio of the SRAM cell 100A and/or the SRAM cell 100B is in a range from about 1.1 to about 1.5, which is sufficiently large to reduce the pass-gate transistors effect on the latches of the SRAM cell 100A and/or the SRAM cell 100B during read operations, thereby improving read stability of the latches (i.e., the SRAM cell's state can be read without disturbing the latches, such as causing the latch states to flip).

In the present disclosure, the gate structures 208A to 208N of the SRAM array 100 are separated from each other by a distance S1 in the second direction, as the distance S1 shown in FIG. 6A. Shrink of the gate length (the dimension L2) of PD portions (208-PD) further provides different distances between the gate structures of the SRAM array 100. For example, shrink of the gate length (the dimension L2) of the PD portions (208-PD) provides a distance S2 between the PD portion 208-PD of the gate structure 208B and the PD portion 208-PD of the gate structure 208F. A distance between the PU portion 208-PU of the gate structure 208B and the PU portion 208-PU of the gate structure 208F remains the distance S1. The distance S2 is greater than the distance S1. In some embodiments, the distance S1 is in a range from about 40 nm to about 60 nm. In some embodiments, the distance S2 is in a range from about 40 nm to about 60 nm.

Still referring to FIGS. 6A to 6D, the SRAM array 100 further includes source/drain contacts 226A to 226E for SRAM cells 100A and 100B. The source/drain contacts 226A to 226E extend lengthwise in the first direction, are disposed between the gate structures 208A to 208H, and disposed over the source/drain features 218. Specifically, each of the source/drain contacts 226A is disposed between the gate structures for the pull-down transistors PD-1 and PD-2, such as gate structures 208B and 208F (or PD portions 208-PD). Each of the source/drain contacts 226B is disposed between the gate structures for the pull-up transistors PU-1 and PU-2, such as gate structures 208B and 208F (or PU portions 208-PU). Each of the source/drain contacts 226C is disposed between the gate structures for the pass-gate transistors PG-1 and PG-2 and the gate structures for the pull-down transistors PD-1 and PD-2, such as gate structures 208B and 208D. The source/drain contacts 226C are also disposed between the gate structures for the pull-up transistors PU-1 and PU-2, such as gate structures 208A and 208B (or PU portions 208-PU). Each of the source/drain contacts 226D is disposed between the gate structures for the pass-gate transistors PG-1, such as gate structures 208C and 208G. Each of the source/drain contacts 226E is disposed between the gate structures for the pass-gate transistors PG-1, such as gate structures 208D and 208P. The source/drain contacts 226A to 226E may each include a conductive material such as Al, Cu, W, Co, Ti, Ta, Ru, TiN, TiAl, TiAlN, TaN, TaC, combinations of these, or the like, although any suitable material may be deposited using a deposition process such as sputtering, CVD, electroplating, electroless plating, or the like.

As shown in FIGS. 6A to 6D, since shrink of the gate length (the dimension L2) of the PD portions (208-PD) provides a larger space between the PD portions (i.e. the distance S2 greater than the distance S1), the size of the source/drain contacts 226A may be tuned for improving the performance of the SRAM array 100. For example, the source/drain contacts 226A to 226E each originally has a dimension W1 in the second direction. Then, the dimension W1 of the source/drain contacts 226A is enlarged into a dimension W2 in the second direction, as shown in FIGS. 6A and 6D. The dimension W2 is greater than the dimension W1. In some embodiments, the dimension W1 is in a range from about 20 nm to about 30 nm. In some embodiments, the dimension W2 is in a range from about 21 nm to about 34 nm. The enlarged source/drain contacts 226A have a lower source/drain contact resistance, which improves the performance of the SRAM array 100.

In the present embodiment, it should be noted that a distance D1 between each of the source/drain contacts 226A and the adjacent gate structure in the second direction and a distance D2 between each of the source/drain contacts 226B to 226E and the adjacent gate structure in the second direction are the same. For example, the distance D1 between the source/drain contact 226A and the gate structure 208E (the PD portion 208-PD) in the second direction and the distance D2 between the source/drain contact 226B and the gate structure 208E (the PU portion 208-PD) are the same. In some embodiments where the size of the source/drain contacts 226A remain the same (i.e., having the dimension W1), the distance D1 is greater than the distance D2, which is further illustrated below.

The source/drain contacts 226A are coupled to the power supply voltage ($V_{SS}$) (not shown) to serve as the voltage node $V_{SS}$ of the SRAM cell, to supply voltage to the source/drain feature 218 of the pull-down transistors PD-1 and PD-2. The source/drain contact 226A may also be referred to as a $V_{SS}$ line, $V_{SS}$ node, or $V_{SS}$ conductor. The source/drain contacts 226B are coupled to the power supply voltage ($V_{DD}$) (not shown) to serve as the voltage node $V_{DD}$ of the SRAM cell to supply voltage to the source/drain feature 218 of the pull-up transistors PU-1 and PU-2. The source/drain contact 226B may also be referred to as a $V_{DD}$ line, $V_{DD}$ node, or $V_{DD}$ conductor. The source/drain contacts 226C each electrically couples the source/drain feature 218 of (or between) the pass-gate transistor (PG-1, PG-2) and the pull-down transistor (PD-1, PD-2) (or common drain) to the source/drain feature 218 of the pull-up transistor (PU-1, PU-2), which corresponds to the storage node SN and the storage node SNB shown in FIG. 2. The source/drain contacts 226C may also be referred to as storage nodes or storage node conductors. The source/drain contacts 226D and 226E are respectively coupled to the bit line (not shown) and the complementary bit line (not shown) to serve as bit line node and complementary bit line node. The source/drain contacts 226D may also be referred to as bit line node conductors. The source/drain contacts 226E may also be referred to as complementary bit line node conductors.

The SRAM array 100 further includes various isolation structures. For example, as shown in FIG. 6B, isolation structures 230 separate the adjacent gate structures 208A and 208D in the first direction. The isolation structures 230 includes silicon oxide, silicon nitride, silicon oxynitride, other suitable isolation material (for example, including silicon, oxygen, nitrogen, carbon, or other suitable isolation constituent), or combinations thereof. In some embodiments, the isolation structures 230 has a multi-layer structure.

The SRAM array 100 may further include an interlayer dielectric (ILD) layer 232 between the source/drain features 218 and between the source/drain contacts 226A to 226E (such as the source/drain contacts 226C shown in FIG. 6C), and an ILD layer 234 over the ILD layer 232, the isolation structures 230, the source/drain contacts 226A to 226E, and source/drain features 218. The ILD layers 232 and 234 includes a dielectric material including, for example, silicon oxide, silicon nitride, silicon oxynitride, TEOS-formed oxide, PSG, BPSG, low-k dielectric material, other suitable dielectric material, or combinations thereof. Exemplary low-k dielectric materials include FSG, carbon doped silicon oxide, Black Diamond® (Applied Materials of Santa Clara, California), Xerogel, Aerogel, amorphous fluorinated carbon, Parylene, BCB, SiLK (Dow Chemical, Midland, Michigan), polyimide, other low-k dielectric material, or combinations thereof. In some embodiments, The ILD layers 232 and 234 are a dielectric layer that includes a low-k dielectric material (generally referred to as a low-k dielectric layer). The ILD layers 232 and 234 can include a multilayer structure having multiple dielectric materials.

The butted contacts 228 are disposed in the ILD layer 234 to electrically connect the source/drain contacts 226C to the gate structures. For example, in the SRAM cell 100A of FIG. 6A, one butted contact 228 electrically connect the source/drain contact 226C, for the source/drain features 218 of the pull-down transistor PD-1, the pull-up transistor PU-1, and the pass-gate transistor PG-1, to the gate structure 208B, and another butted contact 228 electrically connect the source/drain contact 226C, for the source/drain features 218 of the pull-down transistor PD-2, the pull-up transistor PU-2, and the pass-gate transistor PG-2, to the gate structure 208A.

In some embodiments, additional features are formed in between the source/drain features 218 and the source/drain contacts 226A to 226E, such as silicide features 236. The silicide features 236 may include titanium silicide (TiSi), nickel silicide (NiSi), tungsten silicide (WSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), or other suitable compounds in order to reduce the Schottky barrier height of the source/drain contacts 226A to 226E.

The SRAM array 100 may further include inner spacers 238 disposed on sidewalls of the lower portion of each of the gate structures 208A to 208R and separate the gate structures 208A to 208R from the adjacent S/D features 218, as shown in FIG. 6D. The inner spacers 238 are also disposed below the gate spacers 214 and between the nanostructures 220. In some embodiments, the inner spacers 238 have the same material as the gate spacers 214. In other embodiments, the inner spacers 238 have a different material than the gate spacers 214.

Figure 7:
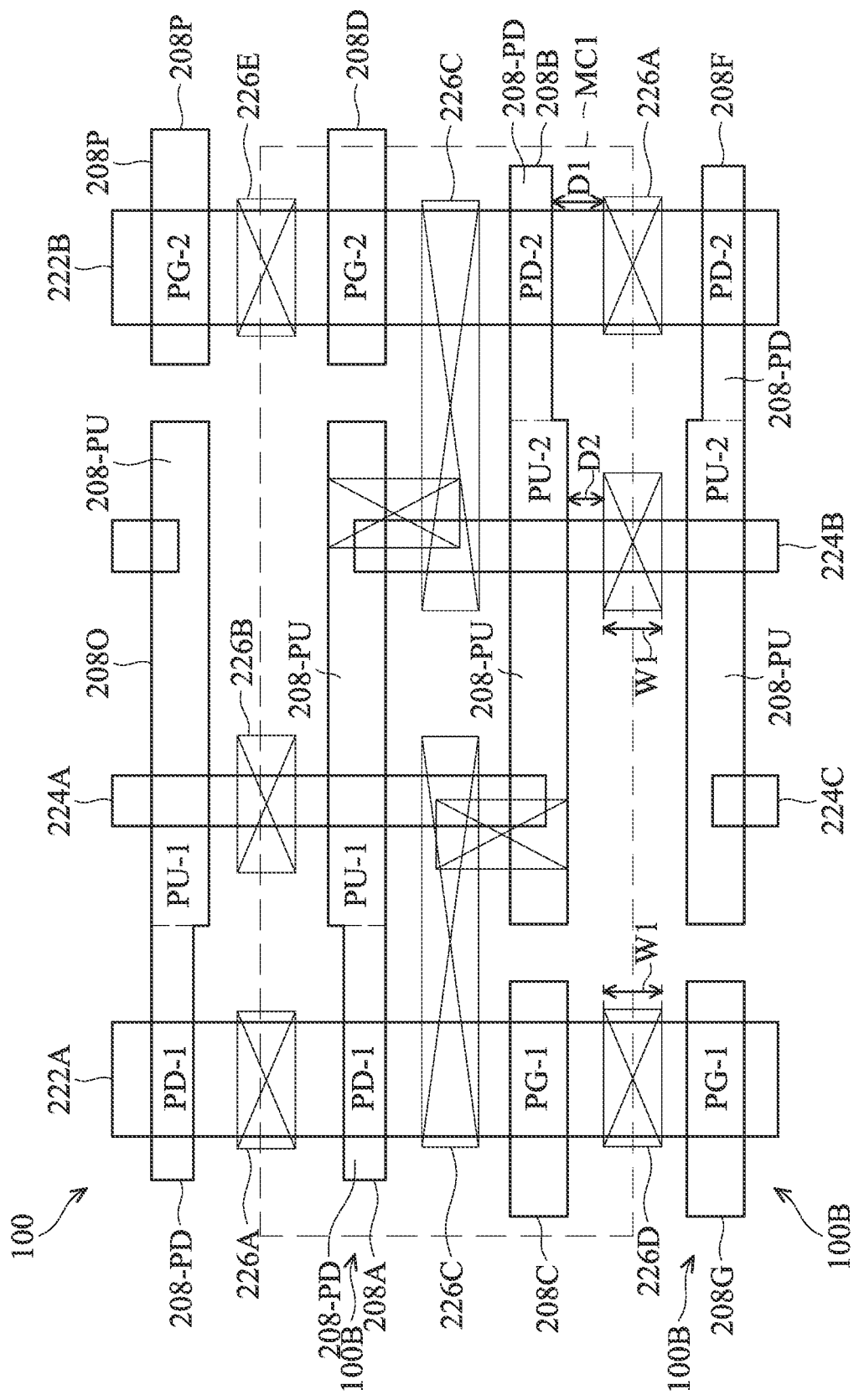
FIG. 7 is a fragmentary diagrammatic top view of a portion of a layout of an SRAM array, in accordance with some alternative embodiments.

FIG. 7 is a fragmentary diagrammatic top view of a portion of a layout of an SRAM array 100, in accordance with some alternative embodiments. As discussed above, in some embodiments, the size of the source/drain contacts 226A may remain. In other words, all of the source/drain contacts 226A to 226E have the dimension W1 in the second direction. In such embodiments, the distance D1 between each of the source/drain contacts 226A and the adjacent gate structure in the second direction is greater than the distance D2 between each of the source/drain contacts 226B to 226E and the adjacent gate structure in the second direction. For example, the distance D1 between the source/drain contact 226A and the gate structure 208B (the PD portion 208-PD) in the second direction is greater than the distance D2 between the source/drain contact 226B and the gate structure 208B (the PU portion 208-PD).

In some embodiments, the PD portion and the PU portion of the gate structure shared by the pull-down transistor (PD-1, PD-2) and the pull-up transistor (PU-1, PU-2) each has two edges in the first direction in the top view. One edge of the PD portion and one edge of the PU portion are aligned with each other in the first direction, and the other edge of the PD portion and the other edge of the PU portion are offset from each other in the first direction. For example, referring back to FIG. 6A, taking the gate structures 208B and 208F for example, edges facing the source/drain contacts 226C of the PD portions 208-PD of the gate structures 208B and 208F are respectively aligned to edges facing the source/drain contacts 226C of the PU portions 208-PU of the gate structures 208B and 208F in the first direction; and edges facing the source/drain contact 226A of the PD portions 208-PD of the gate structures 208B and 208F are respectively offset from edges facing the source/drain contact 226B of the PU portions 208-PU of the gate structures 208B and 208F in the first direction.

Figure 8:
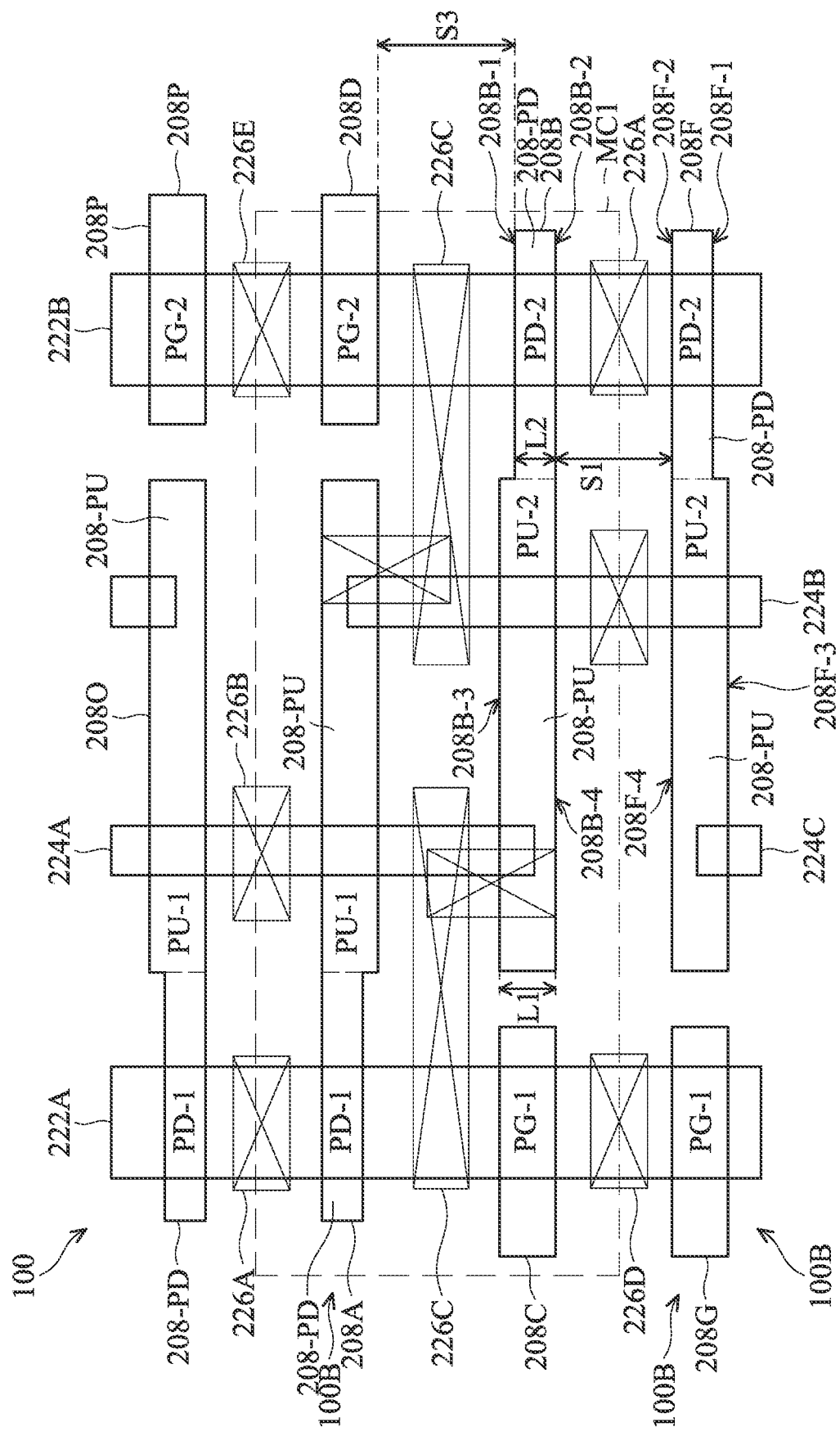
FIG. 8 is a fragmentary diagrammatic top view of a portion of a layout of an SRAM array, in accordance with some alternative embodiments.

FIG. 8 is a fragmentary diagrammatic top view of a portion of a layout of an SRAM array 100, in accordance with some alternative embodiments. The layout in these embodiments are similar to the one shown in FIG. 6A. Differences among them are the offset way between the PD portions 208-PD and the PU portions 208-PU. In FIG. 8, taking the gate structures 208B and 208F for example, edges 208B-1 and 208F-1 facing the source/drain contacts 226C (which adjacent to the gate structure 208F are omitted in FIG. 8) of the PD portions 208-PD of the gate structures 208B and 208F are respectively offset from edges 208B-3 and 208F-3 facing the source/drain contacts 226C of the PU portions 208-PU of the gate structures 208B and 208F in the first direction; and edges 208B-2 and 208F-2 facing the source/drain contact 226A of the PD portions 208-PD of the gate structures 208B and 208F are respectively aligned to edges 208B-4 and 208F-4 facing the source/drain contact 226B of the PU portions 208-PU of the gate structures 208B and 208F in the first direction.

In these embodiments, a distance between the PD portion 208-PD of the gate structure 208B and the PD portion 208-PD of the gate structure 208F remains the same as the distance S1 discussed above (which is same as the distance between the PU portion 208-PU of the gate structure 208B and the PU portion 208-PU of the gate structure 208F). Furthermore, these embodiments provide a distance S3 between the PD portion 208-PD and the gate structure of the pass-gate transistor (PG-1, PG-2), as shown in FIG. 8. The distance S3 is greater than the distance S1.

Figure 9:
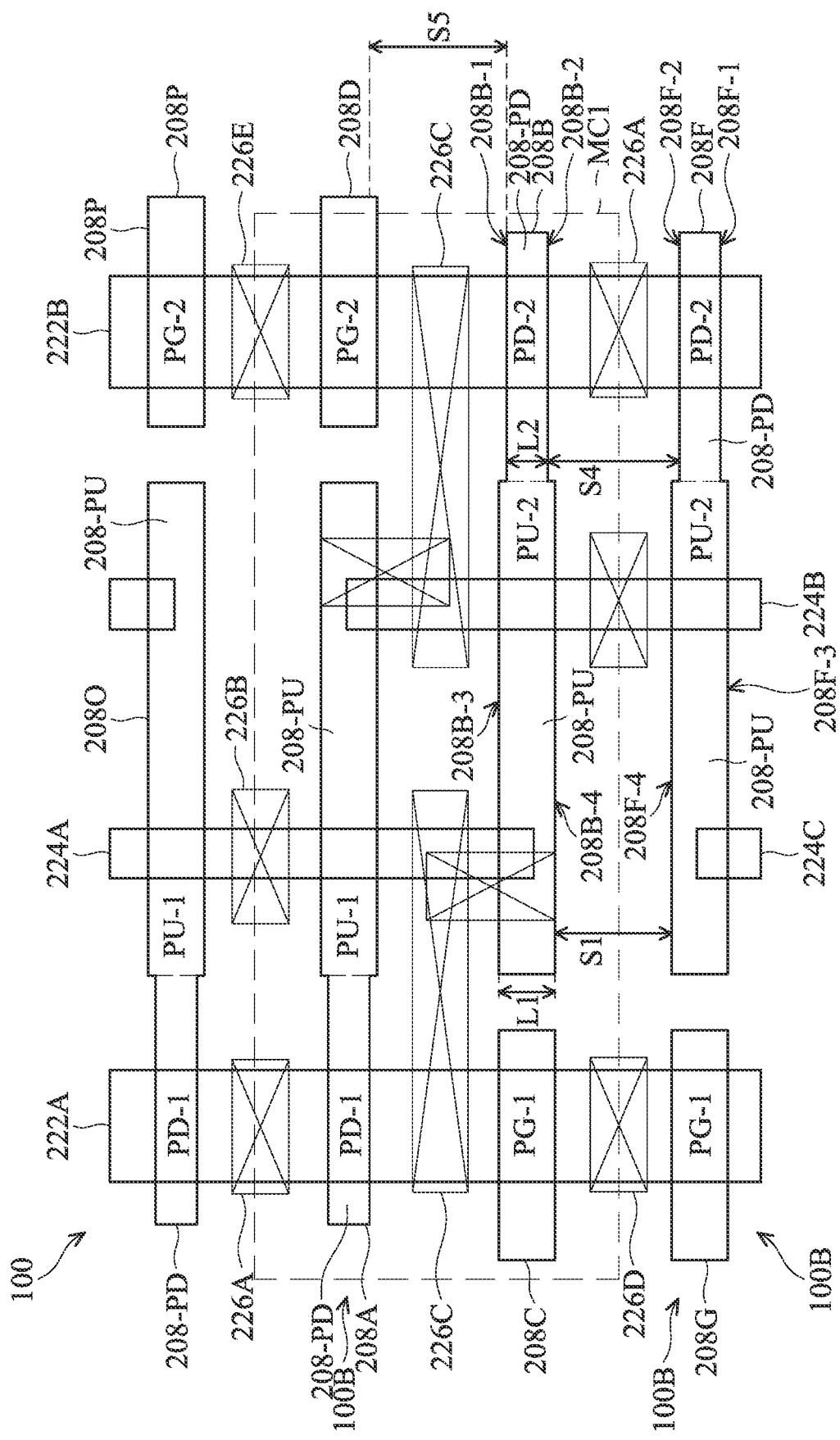
FIG. 9 is a fragmentary diagrammatic top view of a portion of a layout of an SRAM array, in accordance with some alternative embodiments.

FIG. 9 is a fragmentary diagrammatic top view of a portion of a layout of an SRAM array 100, in accordance with some alternative embodiments. The layout in these embodiments are similar to the one shown in FIG. 6A. Differences among them are the offset way between the PD portions 208-PD and the PU portions 208-PU. In FIG. 9, taking the gate structures 208B and 208F for example, edges 208B-1 and 208F-1 facing the source/drain contacts 226C (which adjacent to the gate structure 208F are omitted in FIG. 8) of the PD portions 208-PD of the gate structures 208B and 208F are respectively offset from edges 208B-3 and 208F-3 facing the source/drain contacts 226C of the PU portions 208-PU of the gate structures 208B and 208F in the first direction; and edges 208B-2 and 208F-2 facing the source/drain contact 226A of the PD portions 208-PD of the gate structures 208B and 208F are also respectively offset from edges 208B-4 and 208F-4 facing the source/drain contact 226B of the PU portions 208-PU of the gate structures 208B and 208F in the first direction.

In these embodiments, a distance S4 is provided between the PD portion 208-PD of the gate structure 208B and the PD portion 208-PD of the gate structure 208F. Furthermore, these embodiments provide a distance S5 between the PD portion 208-PD and the gate structure of the pass-gate transistor (PG-1, PG-2), as shown in FIG. 9. The distance S4 is greater than the distance S5, and the distance S5 is greater than the distance S1 discussed above.

Figure 10:
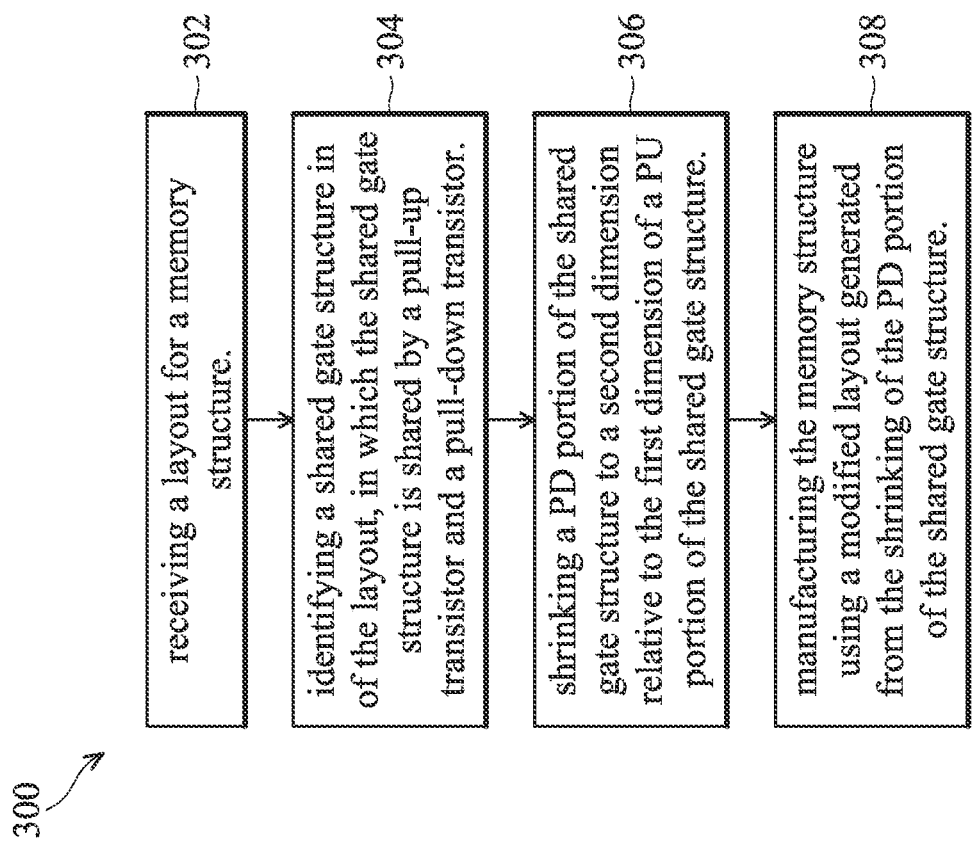
FIG. 10 is a flow chart of a method that can be implemented for memory design and/or memory fabrication, in accordance with some alternative embodiments.

FIG. 10 is a flow chart of a method 300 that can be implemented for memory design and/or memory fabrication, in accordance with some alternative embodiments. The method 300 implements the concepts described herein to optimize memory performance. The method 300 beings at operation 302 with receiving a layout for a memory structure, such as the SRAM array 100 discussed above.

The method 300 can proceed to operation 304 by identifying a shared gate structure in of the layout, such as the gate structures 208A, 208B, 208E, 208F, 208I, 208J, 208L, and 208M discussed above, respectively. The shared gate structure is shared by more than one transistor of the memory structure, and the shared gate structure has a dimension in a second direction. In some embodiments, the shared gate structure is shared by a pull-up transistor and a pull-down transistor of a memory cell, such as an SRAM cell. In such embodiments, the shared gate structure has a PD portion that corresponds with the pull-down transistor and a PG portion that corresponds with the pull-up transistor. For example, as shown in FIG. 5, each of the gate structures 208A, 208B, 208E, 208F, 208I, 208J, 208L, and 208M is shared by the pull-up transistor (PU-1, PU-2) and the pull-down transistor (PD-1, PD-2). The gate structures 208A, 208B, 208E, 208F, 208I, 208J, 208L, and 208M have the original dimension L1 (i.e., the dimension L1 shown in FIG. 6A) in the second direction. The gate structures 208A, 208B, 208E, 208F, 208I, 208J, 208L, and 208M each has the PU portion 208-PU and the PD portion 208-PD.

The method 300 can proceed to operation 306 by shrinking the PD portion of the shared gate structure relative to the PU portion of the shared gate structure. For example, a gate length of the PD portion of the shared gate structure is shrunk from a first dimension to a second dimension relative to the first dimension of a gate length of the PU portion of the shared gate structure, thereby modifying the shared gate structure. For example, as shown in FIG. 6A, each of the gate structures 208A, 208B, 208E, and 208F has the original dimension L1 in the second direction (i.e., an original gate length). Then, the dimension L1 of the PD portions of the gate structures 208A, 208B, 208E, and 208F are shrunk into a dimension L2 relative to the dimension L1 of the PU portions of the gate structures 208A, 208B, 208E, and 208F. In some embodiments, a modified layout is generated from shrinking the PD portion of the shared gate structure.

The method 300 can proceed to operation 308, where a memory structure, such as an SRAM cell or an SRAM array, is fabricated using the modified layout. For example, a fabricated SRAM cell or array, in which a gate length of the pull-down transistor is less than a gate width of the pass-gate transistors, a channel length of the pull-down transistor is less than a channel width of the pass-gate transistors, and a threshold voltage of the pull-down transistor is less than a threshold voltage of the pass-gate transistor, thereby an on-current of the pull-down transistor is greater than an on-current of the pass-gate transistor.

Additional operations can be provided before, during, and after method 300, and some of the operations described can be moved, replaced, or eliminated for additional embodiments of method 300.

The embodiments disclosed herein relate to memory structures and their manufacturing methods, and more particularly to memory structures comprising shrunk gate structures for the pull-down transistors. Furthermore, the present embodiments provide one or more of the following advantages. Shrink of the gate structures for the pull-down transistors provides a ratio of pull-down transistor effective channel length to pass-gate effective channel length that is less than 1, which increases the on-current of the pull-down transistors relative to the on-current of the pass-gate transistors, decreases the threshold voltage of the pull-down transistors relative to the threshold voltage of the pass-gate transistors, and/or increases the β ratio of the SRAM cell to greater than 1, thereby improving SRAM performance.

Thus, one of the embodiments of the present disclosure describes a memory structure that includes a first pull-up (PU) transistor and a first pull-down (PD) transistor sharing a first gate structure extending in a first direction, and a second PU transistor and a second PD transistor sharing a second gate structure extending in the first direction. The first gate structure and the second gate structure are separated in a second direction, wherein the second direction is perpendicular to the first direction. The first gate structure has a first PU portion that corresponds with the first PU transistor and a first PD portion that corresponds with the first PD transistor. The second gate structure has a second PU portion that corresponds with the second PU transistor and a second PD portion that corresponds with the second PD transistor. The first PU portion and the second PU portion each has a first dimension in the second direction, and the first PD portion and the second PD portion each has a second dimension in the second direction, wherein the first dimension is greater than the second dimension.

In some embodiments, the memory structure further includes a pass-gate (PG) transistor arranged with the first PD transistor and the second PD transistor in the second direction. The PG transistor has a third gate structure extending in the first direction. A third dimension of the third gate structure in the second direction and the first dimension are the same.

In some embodiments, a ratio of the third dimension to the second dimension provides a beta ratio in a range from about 1.1 to about 1.5.

In some embodiments, a threshold voltage of the first PD transistor and the second PD transistor is less than a threshold voltage of the PG transistor.

In some embodiments, each of the first PU transistor, the second PU transistor, the first PD transistor, and the second PD transistor has nanostructures that are vertically stacked.

In some embodiments, a distance between the first PD portion and the second PD portion in the second direction is greater than a distance between the first PU portion and the second PU portion in the second direction.

In some embodiments, a distance between the first PD portion and the second PD portion in the second direction and a distance between the first PU portion and the second PU portion in the second direction are the same.

In some embodiments, the memory structure further includes a first source/drain contact and a second source/drain contact. The first source/drain contact is between the first PD portion and the second PD portion. The second source/drain contact is between the first PU portion and the second PU portion. A dimension of the first source/drain contact in the second direction is greater than a dimension of the second source/drain contact in the second direction.

In some embodiments, a distance between the first PD portion and the first source/drain contact in the second direction and a distance between the first PU portion and the second source/drain contact in the second direction are the same.

In some embodiments, the first PU portion and the second PU portion each has a protrusion portion having a third dimension in the second direction, wherein the first dimension is a sum of the second dimension and the third dimension.

In some embodiments, the third dimension is in a range from about 1 nm to about 4 nm.

In another of the embodiments, discussed is a memory structure including a first active area and a second active area extending in a first direction and arranged in a second direction. The second direction is perpendicular to the first direction. In some embodiments, the memory structure further includes a first Static Random Access Memory (SRAM) cell and a second SRAM cell adjacent to the first SRAM cell in the second direction. The first SRAM cell includes a first gate structure extending in the first direction and having a first pull-down (PD) portion and a first pull-up (PU) portion. The first PD portion and the first PU portion respectively engage the first active area and the second active area to construct a first PD transistor and a first PU transistor. The first SRAM cell further includes a second gate structure extending in the first direction and arranged with the first gate structure in the second direction. The first gate structure engages the first active area to construct a first pass-gate (PG) transistor. The second SRAM cell includes a third gate structure extending in the first direction and having a second PD portion and a second PU portion. The second PD portion and the second PU portion respectively engage the first active area and the second active area to construct a second PD transistor and a second PU transistor. The second SRAM cell further includes a fourth gate structure extending in the first direction and arranged with the third gate structure in the second direction. The fourth gate structure engages the first active area to construct a second pass-gate (PG) transistor. In some embodiments, a gate length of the first PU portion, the second PU portion, the second gate structure, and the fourth gate structure is greater than a gate length of the first PD portion and the second PD portion.

In some embodiments, an on-current of the first PD transistor is greater than an on-current of the first PG transistor and an on-current of the second PD transistor that is greater than an on-current of the second PG transistor.

In some embodiments, a ratio of the on-current of the first PD transistor and the on-current of the first PG transistor and a ratio of the on-current of the second PD transistor and the on-current of the second PG transistor are in a range from about 1.1 to about 1.5.

In some embodiments, the memory structure further includes a first source/drain contact and a second source/drain contact. The first source/drain contact is between the first PD portion and the second PD portion. The second source/drain contact is between the first PD portion and the second gate structure. A dimension of the first source/drain contact in the second direction is greater than a dimension of the second source/drain contact in the second direction.

In some embodiments, the dimension of the first source/drain contact is in a range from about 21 nm to about 34 nm and the dimension of the second source/drain contact is in a range from about 20 nm to about 30 nm.

In some embodiments, a distance between the first PD portion and the second PD portion in the second direction is greater than a distance between the first PD portion and the second gate structure in the second direction and a distance between the second PD portion and the fourth gate structure in the second direction.

In some embodiments, a distance between the first PD portion and the second PD portion in the second direction is less than a distance between the first PD portion and the second gate structure in the second direction and a distance between the second PD portion and the fourth gate structure in the second direction.

In yet another of the embodiments, discussed is a method for manufacturing a memory structure that includes identifying a shared gate structure of the layout shared by a pull-up (PU) transistor and a pull-down (PD) transistor. The shared gate structure is extended in a first direction and has a first dimension in a second direction. The second direction is perpendicular to the first direction. In some embodiments, the method further includes shrinking a PD portion of the shared gate structure that corresponds with the PD transistor to a second dimension relative to the first dimension of a PU portion of the shared gate structure that corresponds with the PU transistor; and manufacturing the memory structure using a modified layout generated from the shrinking of the PD portion of the shared gate structure.

In some embodiments, the first dimension is in a range from about 40 nm to about 60 nm, and the second dimension is in a range from about 40 nm to about 60 nm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory structure comprising:
   a first pull-up (PU) transistor and a first pull-down (PD) transistor sharing a first gate structure extending in a first direction;
   a second PU transistor and a second PD transistor sharing a second gate structure extending in the first direction; and an active area shared by the first PD transistor and the second PD transistor, wherein the first gate structure and the second gate structure are separated in a second direction, wherein the second direction is perpendicular to the first direction;

the first gate structure has a first PU portion that corresponds with the first PU transistor and a first PD portion that corresponds with the first PD transistor;

the second gate structure has a second PU portion that corresponds with the second PU transistor and a second PD portion that corresponds with the second PD transistor; and the first PU portion and the second PU portion each has a first dimension in the second direction, and the first PD portion and the second PD portion each has a second dimension in the second direction, wherein the first dimension is greater than the second dimension, wherein a distance between the first PD portion and the second PD portion in the second direction is greater than a distance between the first PU portion and the second PU portion in the second direction.

2. The memory structure of claim 1, further comprising:
a pass-gate (PG) transistor arranged with the first PD transistor and the second PD transistor in the second direction, wherein the PG transistor has a third gate structure extending in the first direction, wherein a third dimension of the third gate structure in the second direction and the first dimension are the same.

3. The memory structure of claim 2, wherein a ratio of the third dimension to the second dimension provides a beta ratio in a range from about 1.1 to about 1.5.

4. The memory structure of claim 2, wherein a threshold voltage of the first PD transistor and the second PD transistor is less than a threshold voltage of the PG transistor.

5. A memory structure comprising:
a first active area and a second active area arranged in a first direction and extending in a second direction, wherein the second direction is perpendicular to the first direction;
a first Static Random Access Memory (SRAM) cell comprising:
a first gate structure extending in the first direction and having a first pull-down (PD) portion and a first pull-up (PU) portion, wherein the first PD portion and the first PU portion respectively engage the first active area and the second active area to construct a first PD transistor and a first PU transistor; and
a second gate structure extending in the first direction and arranged with the first gate structure in the second direction, wherein the second gate structure engages the first active area to construct a first pass-gate (PG) transistor; and
a second SRAM cell adjacent to the first SRAM cell in the second direction, the second SRAM cell comprising:
a third gate structure extending in the first direction and having a second PD portion and a second PU portion, wherein the second PD portion and the second PU portion respectively engage the first active area and the second active area to construct a second PD transistor and a second PU transistor;
a fourth gate structure extending in the first direction and arranged with the third gate structure in the second direction, wherein the fourth gate structure engages the first active area to construct a second pass-gate (PG) transistor;
a first source/drain contact between the first PD portion and the second PD portion; and a second source/drain contact between the first PD portion and the second gate structure, wherein a dimension of the first source/drain contact in the second direction is greater than a dimension of the second source/drain contact in the second direction, wherein a gate length of the first PU portion, the second PU portion, the second gate structure, and the fourth gate structure is greater than a gate length of the first PD portion and the second PD portion.

6. The memory structure of claim 1, wherein each of the first PU transistor, the second PU transistor, the first PD transistor, and the second PD transistor has nanostructures that are vertically stacked.

7. The memory structure of claim 1, wherein a distance between the first PD portion and the second PD portion in the second direction and a distance between the first PU portion and the second PU portion in the second direction are the same.

8. The memory structure of claim 1, further comprising:
a first source/drain contact between the first PD portion and the second PD portion; and
a second source/drain contact between the first PU portion and the second PU portion, wherein a dimension of the first source/drain contact in the second direction is greater than a dimension of the second source/drain contact in the second direction.

9. The memory structure of claim 8, wherein a distance between the first PD portion and the first source/drain contact in the second direction and a distance between the first PU portion and the second source/drain contact in the second direction are the same.

10. The memory structure of claim 1, wherein the first PU portion and the second PU portion each has a protrusion portion having a third dimension in the second direction, wherein the first dimension is a sum of the second dimension and the third dimension.

11. The memory structure of claim 10, wherein the third dimension is in a range from about 1 nm to about 4 nm.

12. The memory structure of claim 5, wherein the dimension of the first source/drain contact is in a range from about 21 nm to about 34 nm and the dimension of the second source/drain contact is in a range from about 20 nm to about 30 nm.

13. The memory structure of claim 5, wherein an on-current of the first PD transistor is greater than an on-current of the first PG transistor and an on-current of the second PD transistor that is greater than an on-current of the second PG transistor.

14. The memory structure of claim 13, wherein:
a ratio of the on-current of the first PD transistor and the on-current of the first PG transistor and a ratio of the on-current of the second PD transistor and the on-current of the second PG transistor are in a range from about 1.1 to about 1.5.

15. The memory structure of claim 5, wherein:
a distance between the first PD portion and the second PD portion in the second direction is greater than a distance between the first PD portion and the second gate structure in the second direction and a distance between the second PD portion and the fourth gate structure in the second direction.

16. The memory structure of claim 5, wherein:
a distance between the first PD portion and the second PD portion in the second direction is less than a distance between the first PD portion and the second gate structure in the second direction and a distance between the second PD portion and the fourth gate structure in the second direction.

17. A memory structure comprising:
a memory cell comprising:
a first transistor and a second transistor sharing a first gate structure extending in a first direction; and
a third transistor sharing an active area with the second transistor, wherein the active area extends in a second direction perpendicular to the first direction; and
a second gate structure extending in the first direction and engaging the active area to construct the third transistor,
wherein the first gate structure has a first portion that corresponds with the first transistor and a second portion that corresponds with the second transistor,
wherein a ratio of a first dimension of the second gate structure in the second direction to a second dimension of the second portion of the first gate structure in the second direction is not less than 1.1.

18. The memory structure of claim 17, wherein a ratio of the first dimension to the second dimension is in a range from about 1.1 to about 1.5.

19. The memory structure of claim 17, further comprising:
a first source/drain contact and a second source/drain contact on opposite sides of the second portion of the first gate structure in the second direction,
wherein the first source/drain contact is between the second portion of the first gate structure and the second gate structure in the second direction,
wherein a dimension of the first source/drain contact in the second direction and a dimension of the second source/drain contact in the second direction are different.

20. The memory structure of claim 17, further comprising:
a fourth transistor having a third gate structure extending in the first direction and arranged with the first gate structure in the first direction,
wherein a first sidewall of the third gate structure, a first sidewall of the first portion of the first gate structure, and a first sidewall of the second portion of the first gate structure are aligned with each other in the first direction,
wherein a second sidewall of the third gate structure and a second sidewall of the first portion of the first gate structure are aligned with each other and in the first direction and misalign with a second sidewall of the second portion of the first gate structure.

* * * * *